United States Patent [19]

Schwee et al.

[11] 4,231,107

[45] Oct. 28, 1980

[54] SERRIFORM STRIP CROSSTIE MEMORY

[75] Inventors: Leonard J. Schwee, Colesville; Henry R. Irons; Wallace E. Anderson, both of Beltsville, all of Md.

[73] Assignee: The United States of America as represented by the Secretary of the Navy, Washington, D.C.

[21] Appl. No.: 877,633

[22] Filed: Feb. 14, 1978

[51] Int. Cl.³ .............................................. G11C 19/08

[52] U.S. Cl. ...................................... 365/87; 365/172

[58] Field of Search .......................... 365/87, 171, 172

[56] References Cited

U.S. PATENT DOCUMENTS

| | | | |
|---|---|---|---|
| 3,868,659 | 2/1975 | Schwee | 365/87 |
| 3,972,595 | 8/1976 | Romankiw et al. | 350/267 |
| 4,080,591 | 3/1978 | Torok | 365/171 |

FOREIGN PATENT DOCUMENTS

| | | | |
|---|---|---|---|
| 1255629 | 12/1971 | United Kingdom | 365/172 |

OTHER PUBLICATIONS

IBM Technical Disclosure Bulletin–vol. 17, No. 11; Apr. 1975, pp. 3474–3477.

AIP Conference on Magnetism & Magnetic Materials, Dec. 9–12, 1975, pp. 624–625.

*Primary Examiner*—James W. Moffitt
*Attorney, Agent, or Firm*—R. S. Sciascia; A. L. Branning; R. E. Bushnell

[57] ABSTRACT

A magnetic crosstie memory using a plurality of Permalloy thin-film strips of uniform thicknesses having parallel denticulated margins etched to align with the oblong axis of the strip. Each pair of opposite denticles defines a distinct memory cell. Magnetization relaxes upon removal of a magnetic field applied normal to the oblong axis of the thin-film with each component assuming that orientation requiring the least rotation for parallel alignment with the least distant edge. Two domains are thus formed with a domain wall suitable for storage and propagation of binary information centered between the margins and extending the length of the strip. Crossties form at the necks of the serrations and Bloch lines are positioned in potential wells between the necks. Binary information, represented by the crosstie and Bloch lines in various conventions is propagated along the domain wall from cell to cell by particular sequences of magnetic pulses.

77 Claims, 28 Drawing Figures

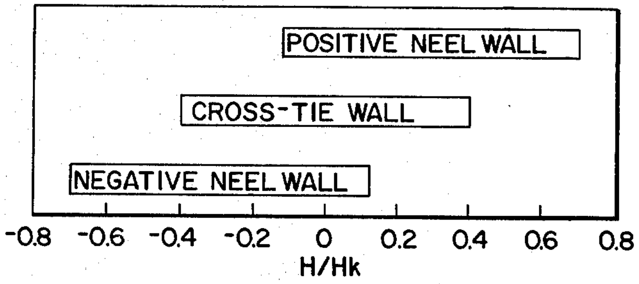
FIG. 3
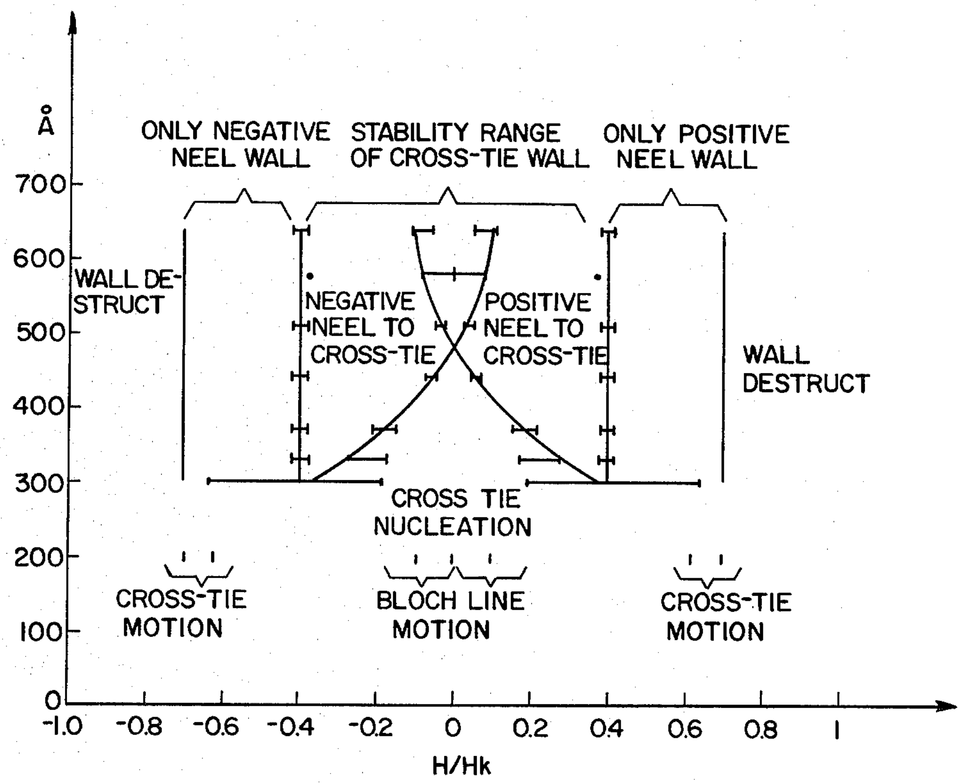
FIG. 4
FIG. 5
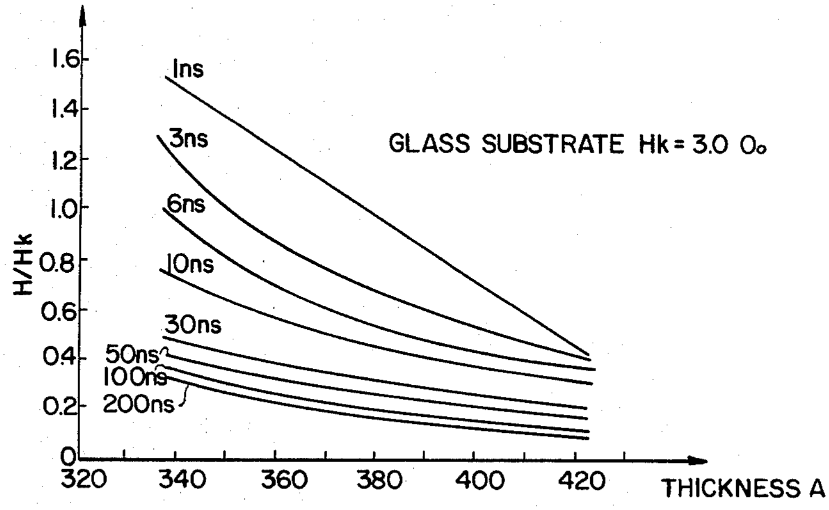

SERRIFORM STRIP CROSSTIE MEMORY

CROSS REFERENCE TO RELATED APPLICATIONS

This application makes reference to our earlier field application, Ser. No. 720,296, filed on the 3rd day of Sept. 1976, now abandoned, for the purpose of obtaining the benefits specified under 35 U.S.C. section 120.

BACKGROUND OF THE INVENTION

This invention relates to the art of shift registers and more particularly, to serial access, thin-film magnetic memories using domain walls for the storage and propagation of binary information and to processes for making and using these devices. Prior thin-film shift register art discloses serial access memories with storage and propagation of reversal domains, e.g., U.S. Pat. No. 3,846,770, and inversion of Neel walls with storage and propagation of Bloch lines, crossties, and inverted Neel walls along a domain wall, e.g., U.S. Pat. No. 3,868,659. The development of thin magnetic film shift registers with domain wall storage and propagation is quite recent, and for the benefit of those who may not be familiar with this art, a brief review follows.

In a serial access memory on a thin magnetic film such as a 320 Å thick layer of 80%-20% Ni-Fe composition, a plurality of magnetic domains are placed on the thin-film layer by applying electrical currents through wires placed over the layer. Adjacent domains define a common boundary known as a domain wall in which digital information in various conventions may be stored and propagated. Only the data moves in the domain walls with recording and detecting heads, as well as the thin permalloy film layer, remaining stationary. The digital information is read into the memory by placing a fine wire above and parallel to the domain wall and applying a current pulse of proper polarity to invert the Neel wall, form Bloch lines and crossties. Digital information stored in the domain wall is propagated by varying the field produced by conductors located above the domain wall, causing movement of the Bloch lines and relocation of the crossties along the domain wall.

The margins of thin magnetic film memories as taught in the prior art, appear uniformly smooth. Consistency in the travel of the digital information during its propagation necessitates a boundary definition of the individual memory cells in which the crossties and Bloch lines rest between steps in their journey along the domain wall. In one device, a thin wire called a "meander line" through which direct currents of alternating polarity run, was placed in a 45 degree zig-zag configuration above the domain wall. At any particular instant this creates adjoining local magnetic fields of opposite polarity, thereby discouraging a crosstie or Bloch line from progressing more than one cell during each propagation sequence. In another device, the drive line is arranged in series of coplanar straight segments coupled at right angles to form alternately reversed crenelations. The drive current defines adjoining cells by creating local magnetic fields in the plane of the thin-film surface that are oriented antiparallel to each other and normal to the domain wall.

As taught by the prior art, domain walls are placed on the thin-films by one of several techniques such as depositing the film in the presence of localized magnetic fields, annealing the thin-film in the presence of localized magnetic fields, or placing the domain walls at a desired location and then annealing the film in the presence of a hard axis magnetic field. In order to correctly locate the detector, the domain walls must be placed very accurately. The use of a thermal annealing technique for example, allows placement of domain walls with an accuracy of ±1 micron over a 2.5 centimeter length. Alignment of the detector with the domain walls necessitates marking the domain walls. Typically, holes are burned into the thin-film by discharging a capacitor through a tungsten needle held over the domain walls under Kerr effect observation. The holes are mapped under higher magnification and fiducial marks are placed on the substance through a mask aligner, thus providing for the alignment of subsequent masks. Although viable for domain wall placement as taught by the prior art, it is apparent that the techniques are tedious, requiring great manual patience. The lack of readily distinguishable features on the surface of the thin-film means that these devices are not especially susceptible to mass production.

SUMMARY OF THE INVENTION

The present invention provides a thin-film magnetic memory strip having oblongly symmetric serriform margins and using stationary domain walls containing Bloch lines, crossties, and Neel walls as shift register tracks for storage and propagation of binary information, and an etching process for making the strips. The edge effect of the margin serrations upon magnetization, a form of shape ansiotropy, inherently defines memory cell boundaries in the domain walls, thereby giving the crossties and Bloch lines preferred locations and allowing the use of a simplified propagation scheme.

Accordingly, it is an object of the present invention to provide a method for fabrication of thin-film magnetic memories.

It is another object of the present invention to provide a simplified and more accurate method for placement of domain walls.

It is another object of the present invention to provide a simplified and more accurate method for locating a detector on a thin-film magnetic memory.

It is also an object of the present invention to provide a thin-film magnetic memory susceptible to domain wall propagation and storage of binary information.

It is another object of the present invention to provide a thin-film magnetic memory having inherently defined memory cells in the domain wall.

It is another object of the present invention to provide a thin-film magnetic memory not requiring bias fields for storage and propagation of binary information.

It is another object of the present invention to provide a thin magnetic film memory having a stable domain wall.

It is yet another object of the present invention to provide a magnetic memory device having increased memory density.

It is still yet another object of the present invention to provide a thin-film magnetic memory device requiring less power during operation.

It is a further object of the present invention to provide a non-volatile binary memory.

It is also an object of the present invention to provide a domain wall magnetic memory susceptible to mass production.

It is a still further object of the present invention to provide a simplified method of propagation of binary information along a domain wall.

BRIEF DESCRIPTION OF THE DRAWINGS

A more complete appreciation of this invention, and many of the attendant advantages thereof, will be readily enjoyed as the same becomes better understood by reference to the following detailed description when considered in conjunction with the accompanying drawings in which like numbers indicate the same or similar components, wherein:

FIG. 3 of the drawings is a bar graph illustrating the static stability condition of domain walls for a thin permalloy film of 400 Å thickness.

FIG. 4 of the drawings is a two coordinate graph illustrating the static stability conditions of domain walls as a function of the film thickness.

FIG. 5 of the drawings is a two coordinate graph illustrating the amplitude of pulsed magnetic fields required to nucleate crossties as a function of film thickness.

DETAILED DESCRIPTION OF THE EMBODIMENTS

A domain wall is a boundary between domains in which magnetization occurs in different directions. In ferromagnetic materials, the neighboring magnetic-moments vectors are tightly coupled to form a large net magnetization vector M, which in many situations can be considered uniform over the sample. The direction of magnetization vector M is controlled by the induced anisotropy. In a sample of ferromagnetic material of finite dimension (e.g., a film strip of a uniform 320 Å thickness and having a width sufficient to accommodate the length of a crosstie—10 to 30 microns)- the influence of the edges of the sample upon the alignment of the magneticmoment vectors overwhelms the induced anisotropy causing the direction of the vectors to gradually seek alignment in opposite directions across the width of the sample after application of a magnetic pulse parallel to the width of the sample of sufficient magnitude to cause a nearly equal orientation of the vectors, thereby creating two domains, each domain having an oppositely directed net magnetization vector. The width of the sample required for the orientation of the individual magnetization to differ by 180° is referred to as a "domain wall" and marks the separation between the adjacent, but differently directed domains. At the center or core of the domain wall the individual vectors are oriented in either direction parallel to the width of the sample.

Domain walls have widths ranging from about 200 Å to 20,000 Å, depending upon the type of material and its thickness. There are three types of domain walls occurring in thin permalloy films: the Bloch wall that predominates in bulk materials with 1,000 Å or more of thickness, the unipolar Neel wall found in very thin films of approximately 100 Å thickness, and the crosstie wall. The crosstie wall is stable in magnetic materials of intermediate thickness, and has oppositely oriented sections of Neel walls bounded on one side by a Bloch line and on the other side by a crosstie. As Bloch line and crossties can be predictably nucleated and propelled by application of magnetic fields of measureable amplitude, duration, and direction, the domain wall of a thin magnetic film is particularly adaptable for use as a serially accessible memory such as a shift register.

The crosstie memory taught herein is suitable for use as a disk or drum memory replacement, or a block oriented random access memory, or as a silicon integrated component of a microprocessor. The basic building blocks essential to each of these devices are the thin magnetic film strips serving as shift registers. The crosstie memory stores information in the domain walls of the film strip shift registers rather than in the magnetic domains, and utilizes the amenability of Bloch lines to nucleation and propagation in response to application of distinctive magnetic fields, to represent that information.

Figure 1:
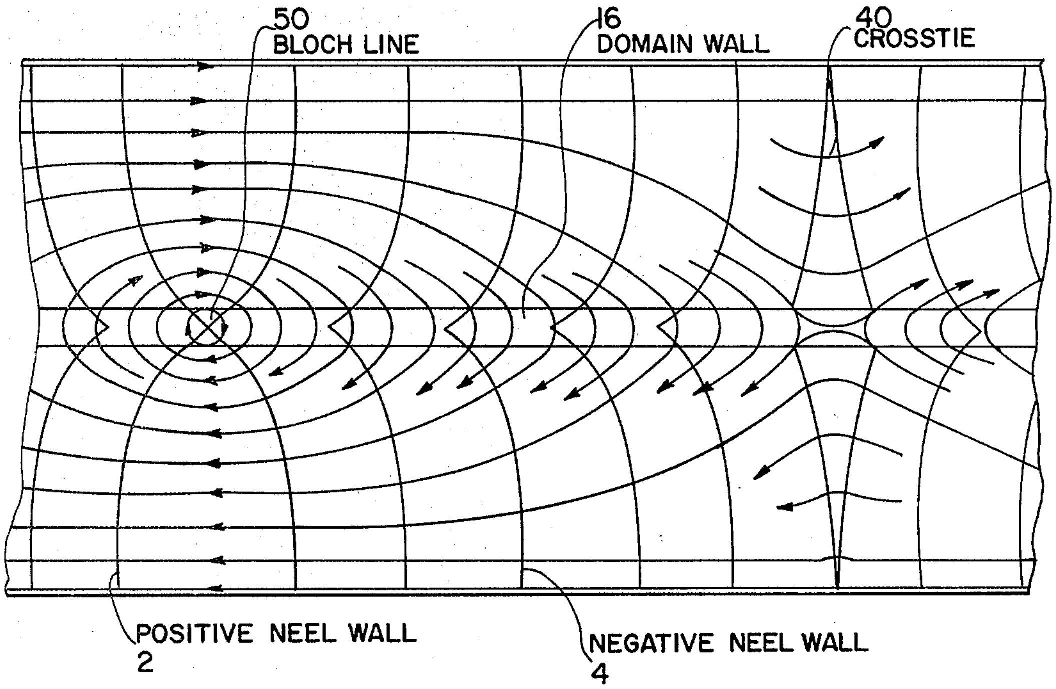
FIG. 1 of the drawings shows an quantitative representation of a crosstie wall on a prior art thin magnetic film.

Referring now to the drawings, and in particular to FIG. 1 where a qualitative description of a crosstie wall superimposed upon a section of a prior art thin-film strip 10 is shown. A section of unipolar Neel wall 2 is separated by a Bloch line 50 from a short section of reversed polarity Neel wall 4. In a Neel wall the magnitization rotates about an axis (i.e., a Bloch line) perpendicular to the plane of the thin-film. The magnetization at the center on core 1 of the wall is in the plane of the surface of the film and can be either up (e.g., a positive Neel wall) or down (e.g., a negative Neel wall). A decrease in the magnetostatic energy of the wall will result when wall segments with opposite magnetization directions alternate along a Neel wall and flux closure between the segments through the adjacent domains occurs. Flux closure occurs only in a direction parallel to the direction of magnetization, and short walls known as crossties 40 positioned perpendicular to the domain wall core 1 are necessary to separate the regions in which flux closure occurs. The length of crosstie 40 approximately equals the width of the Neel wall 4. Much of the flux closes on itself around the Bloch line 50 indicating a circulation or curl. In general, a circulation in a uniform field gives rise to a force. For example, the flux about a current carrying wire in a uniform field creates a force on the wire normal to the directions of the uniform field and the length of the wire. Upon application of a positive or upwardly directed uniform or drive field normal to the easy axis of thin-film strip 10, the Bloch line 50 will move to the left along the domain wall 16 until it approaches another crosstie (not shown). The crosstie 40 will not move unless a field of greater magnitude is applied to thin film 10. If the magnitude of the drive field is increased, the Bloch line 50 and its neighboring crosstie will merge (i.e., annihilation) to produce a unipolar Neel wall. It is in part this propagation and annihilation feature of thin magnetic films that provides their utility as logic devices.

The crosstie differs from the Bloch line in that a coercive force of approximately 0.1 Oe. is required to move the Bloch line while a coercive force of approximately 3.0 Oe. is required to move a crosstie along the domain wall. The dimensions of FIG. 1 correspond to those of the total width of a Neel wall in a 25 micron wide section of thin permalloy film with the anisotropy field $H_k$ approximately equal to 4.0 Oe. The crosstie length equals the Neel wall width. Just as the area occupied by adjacent magnetic domains is large in comparison to that occupied by their common domain wall boundary, the region occupied by Neel walls is large in comparison to that occupied by a Bloch line-crosstie pair. A maximum of approximately 8,000 crossties per inch or 3,000 per centimeter normally occur in a thin permalloy film with $H_k$ equal to 4.0 Oe. This maximum is doubled when the anisotropy field $H_k$ is increased to 16.0 Oe. Unless otherwise stated, for the illustrative purposes of this detailed discussion only the properties of thin permalloy films with $H_k$ approximately equal to 4.0 Oe. will be discussed.

Figure 2:
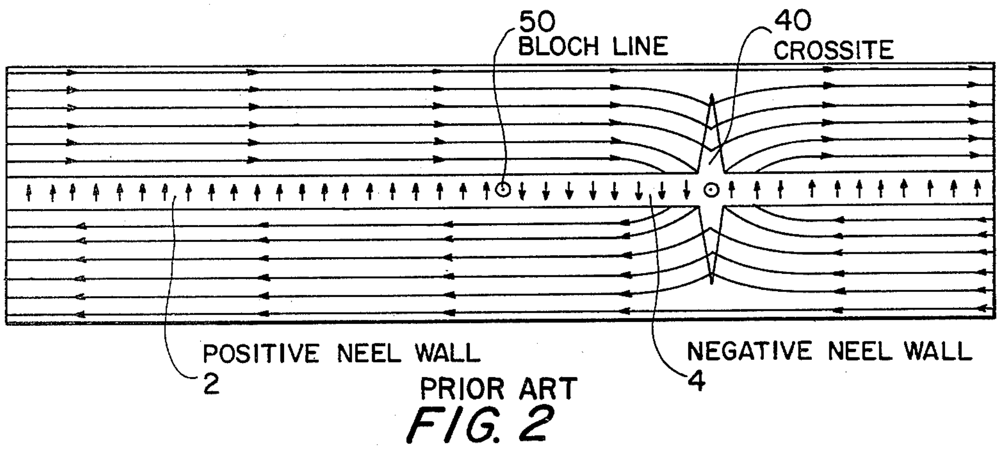
FIG. 2 of the drawings shows a top view of an idealized representation of a crosstie wall on a prior art thin magnetic film.

FIG. 2 sets forth an idealized representation of an example of a section of a prior art thin magnetic film shift register 10. The crosstie domain wall core 1 may be considered to be adjacent Neel wall sections of opposite polarity. As a domain wall is considered to be a boundary between domains, a crosstie 40 and Bloch line 50 pair may be considered to be boundaries between Neel walls 2, 4 of opposite polarity. It is helpful to think of crosstie and Bloch line pairs as forming inner boundaries within the boundary formed by domain wall 16 between the adjoining magnetic domains as their behavior is analogous to the behavior of domain walls with respect to magnetic domains. In the sections of thin-film strips shown in FIGS. 1 and 2 the domain wall occupies substantially the width of the strip.

Referring now to the bar graph of FIG. 3, ranges of stability are shown for Neel and crosstie walls in a typical thin magnetic film strip, here a permalloy film of 400 Å thickness. The overlapping rectangles represent ranges of drive field H over which the denominated types of domain walls are stable as a function of the field $H_k$ first applied along the hard axis of the film strip. For example, if a drive field of $-0.6\ H_k$ is applied to a thin magnetic film strip, its domain wall must be a negative Neel wall and will remain a negative Neel wall as long as the magnitude of the applied drive field is between $-0.7\ H_k$ and $0.12\ H_k$. If a drive field larger than $0.12\ H_k$ is then applied, crossties will be nucleated and a crosstie wall stable during application of drive fields with magnitudes between $-0.4\ H_k$ and $+0.4\ H_k$ will result. To obtain a positive Neel wall, a drive field larger than $0.4\ H_k$ must be applied. At a thickness of 400 Å with no applied field, the domain wall may be either crosstie, positive Neel or negative Neel, depending upon the magnitude of the last field applied and the state of the film before the application of that field.

To study the stability of a domain wall as a function of film thickness, a strip of Permalloy thin-film varying in thickness from 200 Å to 640 Å along its three inch length was studied by the inventors hereto. Stability conditions for Neel and crosstie walls as a function of film thickness are set forth in the graph of FIG. 4. The anisotropy field $H_k$ of the film strip varied from 4 Oe. at 200 Å to 4.8 Oe at 640 Å. In the graph of FIG. 4 the field applied along the hard axis of the film strip is normalized to $H_k$. The values shown in FIG. 3 compare to those shown in FIG. 4 for a film having a 400 Å thickness. As indicated, the stability range of a crosstie is independent of film thickness. Between 300 Å and 640 Å little variation in the magnitude of the applied field is necessary to cause domain wall destruction.

Above 480 Å of thickness, crossties are always present at a zero applied field. Below 440 Å of thickness, it is possible for a Neel wall to be inverted by the motion of a Bloch line that has been generated at an edge of the film or at a defect. Below 400 Å of thickness Bloch line motion along the domain wall makes detection of the nucleation of crossties difficult. The difficulty of detection may be illustrated by applying a field with a magnitude that is gradually increased from a negative to a positive value to a film strip with a negative Neel wall. At approximately 0.05 $H_k$ several Neel walls reverse polarity by Bloch line motion. Although crosstie nucleation occurs concurrently with Bloch line generation, in the 0.05 $H_k$ field region reversal of Neel wall polarity by Bloch line motion is favored. As soon as a crosstie and a Bloch line pair is generated, the Bloch line will move to a location along the domain wall near to its neighboring crosstie. This Bloch line motion between crossties can be observed. Accordingly, only at those Neel walls where polarity reversal did not occur as the applied field approached 0.05 $H_k$ can the nucleation of crossties occur.

Referring now to FIG. 5, the amplitudes of various durations of pulsed magnetic fields required for nucleation of crossties is plotted as a function of the thickness of the film strip. The magnitude of the magnetic field required to generate crossties is inversely proportional to the duration of the pulse. In a film strip approximately 300 Å thick, it is easy to generate periodic crossties about four microns apart if pulsed magnetic fields of one to five nanoseconds are used. Measurement of these values may be best made using a magneto-optic technique. A Bloch line has a mobility of approximately 48,000 centimeters per Oersted-second the in absence of a Bitter solution. If an excessively thick Bitter solution is used there is a likelihood of measurement error as the Bloch line will move slower at the lower field strengths due to its tendency to drag the Bitter solution with it. Additionally, the Bitter solution is inherently slow in its response to an applied pulse and often has a field associated with it of sufficient magnitude to return the Bloch line to its original position once the fast magnetic pulse has ceased. Annihilation of a crosstie-Bloch line pair occurs if the magnetic pulse is of sufficient amplitude and duration to move a Bloch line to the location of its neighboring crosstie. Application of a seven nanosecond pulse of 3.0 Oersteds in amplitude is sufficient in view of the approximately 48,000 centimeter per Oersted-second Bloch line mobility, to cause annihilation of all crossties periodically spaced four to five microns apart.

Figure 6A:
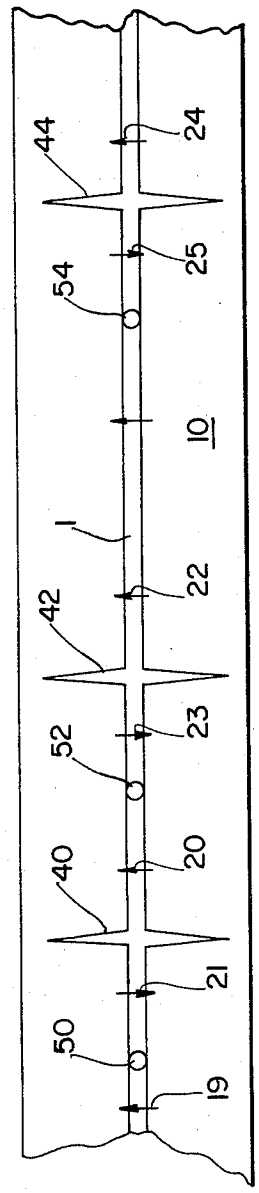
FIG. 6A of the drawings shows a section of a domain wall with three crosstie-Bloch line pairs.
Figure 6B:
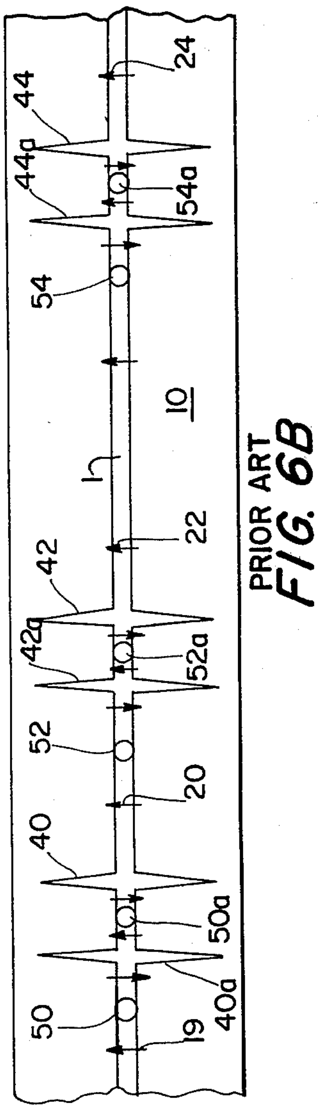
FIG. 6B of the drawings shows the section of domain wall set forth in FIG. 6A subsequent to the application of a one nanosecond magnetic field pulse.

FIG. 6A sets forth an idealized representation of a section of a straight thin-film strip 10 having a domain wall core 1 with three crosstie—Bloch pairs 40–50, 42–52, 44–54. The positive Neel walls 20, 22, 24 are represented by 90 degree vectors while the negative Neel walls 21, 23, 25 are represented by 270 degree vectors. FIG. 6B is an idealized representation of a section of the thin-film strip 10 set forth in FIG. 6A immediately after application of a one nanosecond positive magnetic pulse to each of each of the Neel walls 20, 21, 22, 23, 24, and 25. The positive Neel walls 20, 22, 24 retain their polarity and location despite application of the one nanosecond pulse. The application of the positive pulse to negative Neel walls 21, 23, 25 however, precipitates nucleation of periodic crosstie—Bloch line pairs **40*a*–50*a*, 42*a*–52*a*, 44*a*–54*a*. The Bloch lines 50, 50*a*, 52, 52*a*, 54, 54*a* represent a circulation or curl of the magnetic flux lines in the plane of the permalloy strip 10 and naturally seek positions along the domain wall of strip 10 that provide the least flux density. The crossties 40*a*, 40, 42*a*, 44*a*, 44** represent the separation or boundary between adjacent Neel wall regions of opposite polarity. A Bloch line is naturally repelled by a crosstie. In a zero applied magnetic field a Bloch line wall move about fifteen to twenty-five microns from the nearest crosstie. If a one nanosecond pulse creates a new Bloch line-crosstie pair between an existing Bloch line-crosstie pair, the existing Bloch line will be repelled by the new crosstie to a position along the domain wall, approximately fifteen microns distant from the new crosstie.

THE SERRATED STRIP

Figure 7:
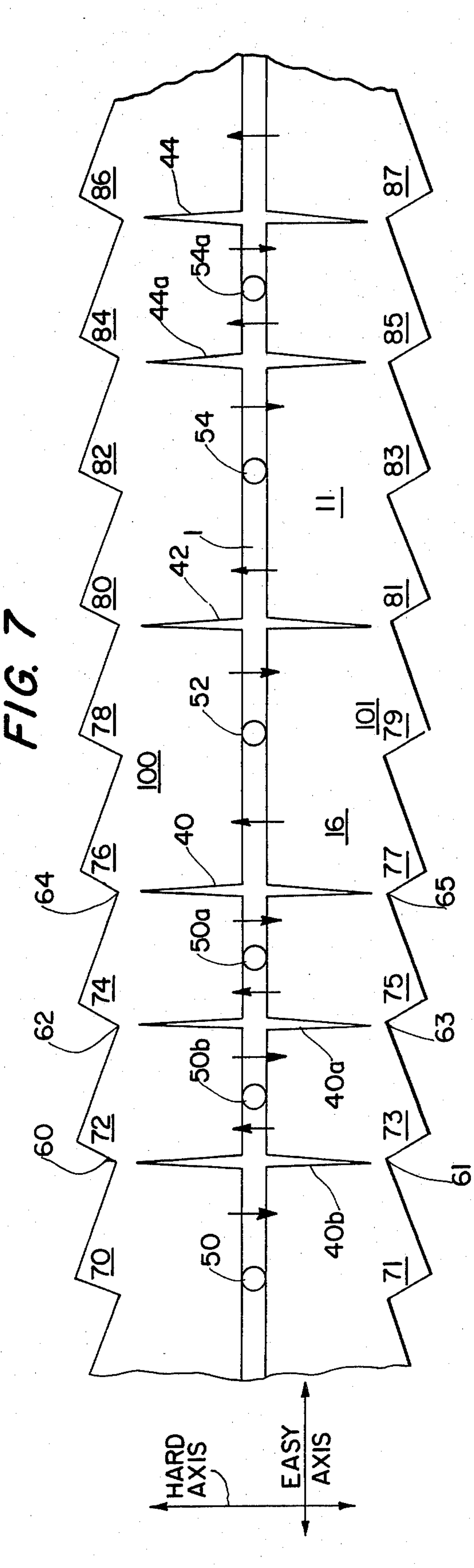
FIG. 7 of the drawings shows a top view of a section of a dentate thin magnetic film strip.

To reliably employ domain walls as shift register tracks, it is necessary to be able to position the walls in a readily ascertainable location in order that a sensor for measuring the voltage at the core of the wall may be accurately positioned over the core. Refer now to FIG. 7, where an idealized representation of an enlarged top view of a section of the surface of a thin permalloy film strip 11 is shown. The oblongly dentate strip 11 is fabricated so that its greatest surface dimension, its length, is parallel to the oblong axis, which here is also the easy axis of the film. The edges of strip 11 are defined by two parallel serriform margins 100, 101 symmetric about and each parallel to an oblong axis of the film that is centered on the length of strip 11. One or more of these serriform strips 11 may be made by etching a permalloy film that is between 300 A and 450 A thick.

The denticulation of each margin 100, 101, a series of evenly spaced, substantially uniform, abutting denticles 70–87, is aligned parallel with the length of strip 11 and thus, with the easy axis of the thin film. For reasons hereinafter set forth, the denticulation of the margins 100, 101 has a mirror image symmetry about the oblong axis of the film and is uniformly asymmetric about an axis such as the traverse axis, that is coplanar with the surface of the film and normal to the elongation of the strip. The core 1 of domain wall 16 forms approximately at the center of film strip 11 and is parallel to the oblong axis after application of an initial magnetic field in excess of the anisotropy field $H_k$ of the film strip, of approximately 20 Oersteds along the traverse axis of the film. Domain wall 16 occupies substantially the entire width of strip 11. For a film with a thickness between 300 Å and 450 Å, after application of the initial magnetic field, application of a one nanosecond magnetic pulse along the opposite hard axis nucleates crossties **40, 40*a*, 40*b*, 42, 44 which form between opposite indents 60–61, 62, 63, 64–65 of the denticulation. The accompanying Bloch lines 50, 50*a*, 50*b*, 52, 54 seek those locations along the domain wall between pairs of opposite indents of the denticulation where the cross section of the part of thin film strip 11 normal to the domain wall 16** is greatest. These locations may be thought of as potential wells for Bloch lines as they allow for the greatest dispersion of the flux lines surrounding a Bloch line and thus, the least flux density.

Figure 8B:
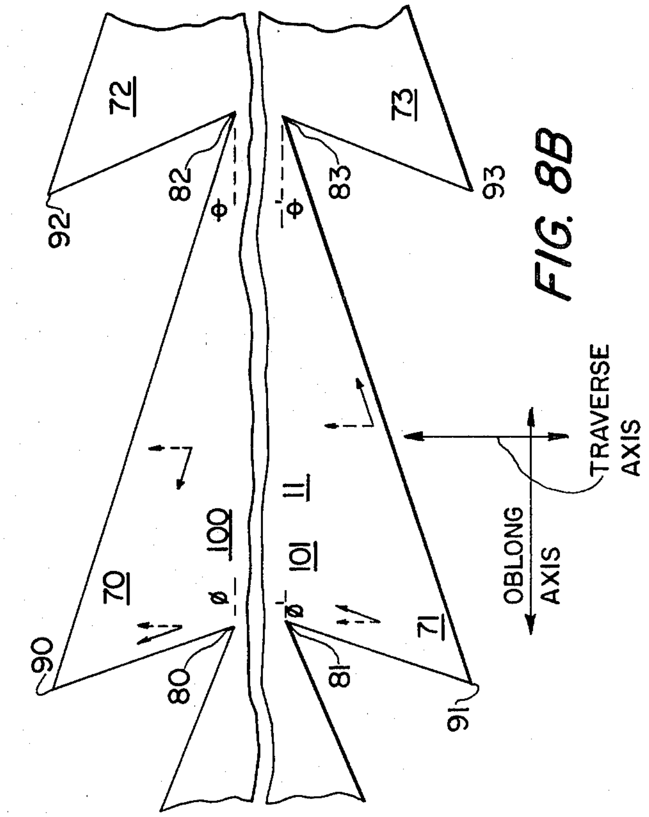
FIG. 8B of the drawings shows a variation of the margin deniculation shown in FIG. 8A.
Figure 8A:
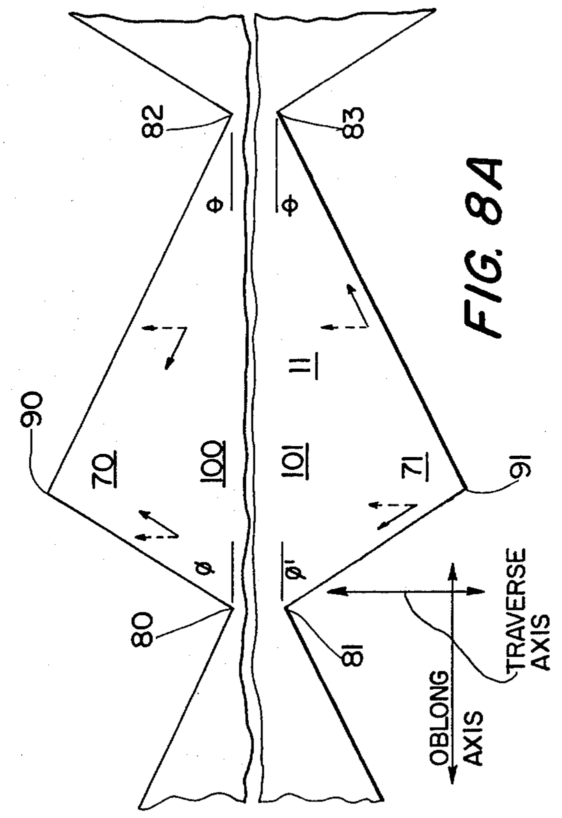
FIG. 8A of the drawings shows an enlargement of a sectionalized segment of a dentate thin magnetic film.
Figure 7A:
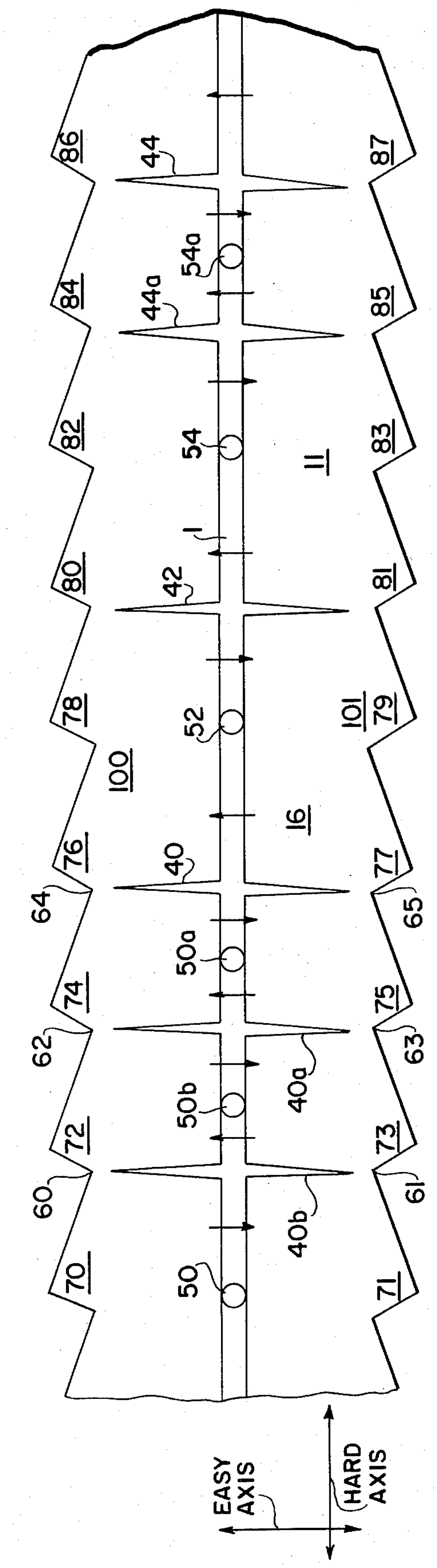
FIG. 7A is a top view of a dentate thin magnetic film strip with its imaginary centerline aligned parallel to the hard axis.
Figure 7B:
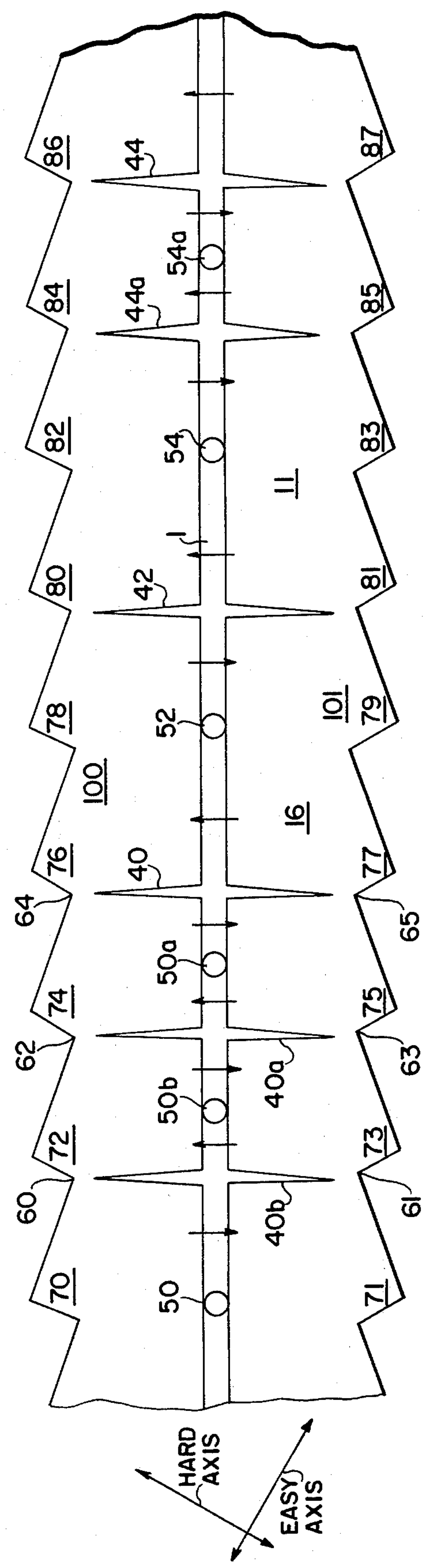
FIG. 7B is a top view of a dentate thin magnetic film strip with its imaginary centerline oblique to the easy and hard axes.

Referring now to FIGS. 8A and 8B, wherein FIG. 8A, an enlargement of the denticulation of margins 100, 101 of a sectionalized segment of a thin-film strip 11 as set forth in FIG. 7, shows a pair of denticles 70, 71 situated on diametrically opposed sides of any oblong of the thin film that is centered along the length of strip 11. FIG. 8B shows a sectionalized segment of a thin-film strip 11 with a runcinate variation of the denticulation set forth in FIG. 8A. Any of those points 80, 81, 82, 83 along the edges of margins 100, 101 that are set in and are therefore closer than any of their respective neighboring points to a centerline running along the length of strip 11 may be referred to as an "indent". Any opposite pair of indents 80–81, 82–83 may be referred to as a "neck" of film strip 11. That point 90, 91 along the edge of margins 100, 101 between sequential indents 80, 82 and 81, 83 respectively, which is most distant from a centerline running along the length of strip 11 may be referred to as an "apex". The denticles 68–86, and 69–87 in each margin 100, 101 respectively, of film strip 11 as set forth in FIG. 7, are arranged in an abutting sequence with the orientation of all denticles in the same margin being substantially similar in relation to both the easy and hard axes of the film. Accordingly, the denticulation of each serriform margin 100, 101 is etched so that a straight line just touching either the apex 90, 92 94 or 91, 93, 95 of each denticle in a margin 100, 101 respectively, or the necks 80, 82, 84 or 81, 83, 85 formed between abuting denticles in a margin 100, 101 respectively is parallel to the elongation of the strip 11, and therefore, to the oblong or easy axis of the film. In order to assure the formation of a domain wall (not shown) in response to application of the initial magnetic pulse along the traverse or hard axis, the denticulation of both margins 100, 101 is oriented in the same direction along an oblong axis and is typically polyjugate in that any denticle 70 along one serriform margin 100 has an opposite or paired denticle 71 in the other oblong margin 101 so that the denticulation of the strip 11 is asymmetric about an axis such as the traverse axis that is coplanar with but normal to the oblong axis of the film. Predictable location and propagation of crossties and Bloch lines requires the denticulation of opposite margins 100, 101 to be approximately symmetric about an oblong axis of the film centered along the elongation of the strip 11. Each pair of opposite or bijugate denticles 70, 71 may be thought of as a distinct memory cell for the storage or binary information.

The denticles forming the serriform margins 100, 101 are, within the limits set by the present state of the art of etching thin magnetic films, nearly identical in shape, surface area, thickness, and magnetic characteristics. Accordingly, any one denticle such as one of the opposite denticles 70, 71, and its characteristics and properties, as set forth in a critical discussion herein, is exemplary of any other dentiform or serriform aspect of a thin magnetic film strip constructed in accordance with the present teachings.

Denticle 70 is geometrically described by a major side 83–90 and a minor side 90–80 which intersect at apex 90, and a base 80–82. The opposite denticle 71 is described by a major side 83–91 and a minor side 91–81 which intersect at apex 91, and a base 81–83. Bases 80–82 and 81–83 run between sequential indents, 80, 82 and 81, 83 respectively, and lie approximately parallel to the elongation of strip 11 and thus, to the oblong and the easy axes of the film. Projection of a chord running between indent 82 and apex 90 upon the traverse or hard axis of the film will, if base 80–82 is parallel to the oblong axis of the film, equal the projection upon the traverse axis of the film of a chord drawn between apex 90 and indent 80:

(1) CHORD(82–90)·Sine$\theta$=CHORD(90–80)·Sine$\Phi$ where, $\theta=\angle(80\text{–}82\text{–}90)$, $\Phi=\angle(90\text{–}80\text{–}82)$.

This equation also holds true in denticle 71 for chords drawn between indent 83 and apex 91, and apex 91 and indent 81.

While no external field is applied the magnetization in the permalloy film strip 11 may point either to the left parallel to one of the oblong axis directions, or to the right parallel to the opposite oblong axis direction. When a pulsed magnetic field is applied to a film strip 11 in the direction of the traverse axis, normal to the oblong axis, the magnetization of that strip rotates toward alignment with the traverse axis. If the pulse field is small, the magnetization turns only through a very small angle and relaxes by returning to its initial oblong direction after the field ceases. If a field of magnitude greater than the anisotropy field $H_k$ of the film strip 11 is applied along the traverse axis of the strip, the magnetization rotates fully to the traverse direction, forming magnetic poles at the surfaces and edges of the film strip as indicated by the dashed vectors in denticles 70, 71. When that field is reduced or withdrawn, the magnetization becomes unstable and relaxes by rotating toward the oblong axis of the strip. As the magnetization of permalloy films lies parallel to the surfaces and edges when in its lowest energy state (i.e., in the absence of an applied magnetic field), the magnetization along the edges of denticles 70, 71 relaxes by seeking an alignment parallel to the nearest edge and rotates in the direction requiring the least angular change to achieve an orientation most parallel to the nearest edge. Accordingly, after application of the magnetic field along the upward traverse axis, the magnetization close to the major edge 82–90 of denticle 70 rotates counterclockwise from its traverse axis alignment to a parallel alignment with edge 82–90, these alignments being indicated by the dashed and solid vectors respectively, nearest to edge 82–90. Similarly, the magnetization closest to major edge 83–91 of denticle 71 rotates clockwise from its hard axis alignment to an alignment parallel with edge 83–91 as indicated by the dashed and solid vectors respectively, nearest to edge 83–91. In FIG. 8A the magnetization closes to minor edge 90–80 of denticle 70 relaxes by rotating clockwise from its hard axis alignment to an alignment parallel with the edge 90–80 as indicated by the dashed and solid vectors respectively, nearest to edge 90–80; while the magnetization closest to minor edge 91–81 of denticle 71 relaxes by rotating counterclockwise from its hard axis alignment to an alignment parallel with the edge 91–81 as indicated by the dashed and solid vectors respectively, nearest to edge 91–81. In FIG. 8B the minor edges 90–80, 91–81 of denticles 70, 71 respectively, have chords with a slope with respect to the oblong and traverse axis of the film having the same sign as the slope of the chords of the corresponding major edges 82–90, 83–91 respectively. Therefore, in FIG. 8B the magnetization closest to minor edge 90–80 of denticle 70 relaxes by rotating counterclockwise from its traverse axis alignment to an alignment parallel with edge 90–80 as indicated by the dashed and solid vectors respectively, nearest to edge 0–80; while the magnetization closest to minor edge 91–81 of denticle 70 relaxes by rotating clockwise from its traverse axis alignment to an alignment parallel with edge 91–81 as indicated by the dashed and solid vectors respectively, nearest to edge 91–81.

The propensity of the local magnetization to relax from a traverse axis orientation by rotating towards an alignment with the nearest edge creates upon the neighboring units of magnetization one of two opposite torques. In denticle 70 one torque predominates in that area between edge 80–90 and the projection of edge 82–90 upon base 80–82, while the opposite torque predominates in that area between edge 80–90 and the projection of edge 80–90 upon base 80–82. The direction of the net macroscopic magnetization in each denticle 70 is dependent upon the relative magnitudes of the oppositely directed torque. As each torque is proportional to the product of the length of the chord bounding its area of predominance and the sine of twice the included angle, the net torque T is proportional to:

(2) $T \propto A \sin 2\theta - B \sin 2\Phi$ where,

A=chord (82–90)

B=chord (80–90)

$\theta = \angle(8\text{–}82\text{–}90)$ $\Phi = \angle(82\text{–}80\text{–}90)$.

It is essential to the creation of a domain wall (not shown), regardless of whether base (80–82) is approximately parallel to the oblong axis of the thin-film strip that:

(3) $A \sin 2\theta > B \sin 2\Phi$.

This inequality must also hold true for the projection on the oblong axis of the chords of denticle 71. While it is essential that this inequality hold true for all of the denticles of a serriform strip 11, it should be understood that the present teachings require neither that the length of a major chord 82–90, 83–91 exceed the length of the minor chord 90–80, 91–81 with which it intersects at an apex 90, 91, nor that the sign of the slope of intersecting major and minor chords differ with respect to the oblong and traverse axes, nor that the sign of the slope of opposite chords differ with respect to the oblong and traverse axis, nor that any side 82–90, 90–80, 83–91, 81–91 to be a straight line, nor that any base 80–82, 81–83 be parallel to the oblong axis of the film.

In view of inequality (3), the sum of the components of magnetization aligned with the right-to-left oblong axis in denticle 70 exceeds the sum of the components of magnetization aligned with the opposite easy axis; therefore, the oblong axis component of the net magnetization of denticle 70 is aligned with the oblong axis of the film in the right-to-left direction. Similarly, in denticle 71, relaxation of the magnetization results in an oblong axis component of the net magnetization aligned in the left-to-right direction. In FIG. 8B where in each denticle 70, 71 the signs of the slope of the chords describing its edges 80–90, 90–82, 81–91, 91–83 is the same, the oblong axis components of the net magnetization for each margin is greater in magnitude than the corresponding oblong axis component of margins 100, 101 of FIG. 8A. The more distance between a point on the surface of the thin film and the nearest edge, the greater the angular variance between the orientation of magnetization at that point and magnetization at that nearest edge, and the lesser the angular variance between the orientation of magnetization at that point and the oblong axis of the film. Exchange coupling between crystallites of the film causes the orientation of the magnetization of neighboring crystallites to be nearly parallel, thereby extending the alignment of the magnetization in the predominant oblong axis direction across the bases 80–82, 81–83 of denticles 70, 71 and throughout the adjoining areas of margins 100, 101. The boundary between those oppositely directed oblong axis components of the net magnetization fields in each margins is the domain wall 16 (not shown). Accordingly, it is apparent that for a thin magnetic film strip 11 having denticulated margins 100, 101 formed with parallel sequences of abutting denticles 70, 71 for which inequality (3) holds true, regardless of whether or not these margins are normally or eccentrically symmetric about the oblong axis of the film, relaxation of the magnetization of the film after application of a magnetic field along one traverse axis of the film of magnitude greater than the anisotropy field $H_k$ of the film results in an oblong axis component of the net macroscopic magnetization in each margin 100, 101 aligned along opposite oblong axes.

Figure 9:
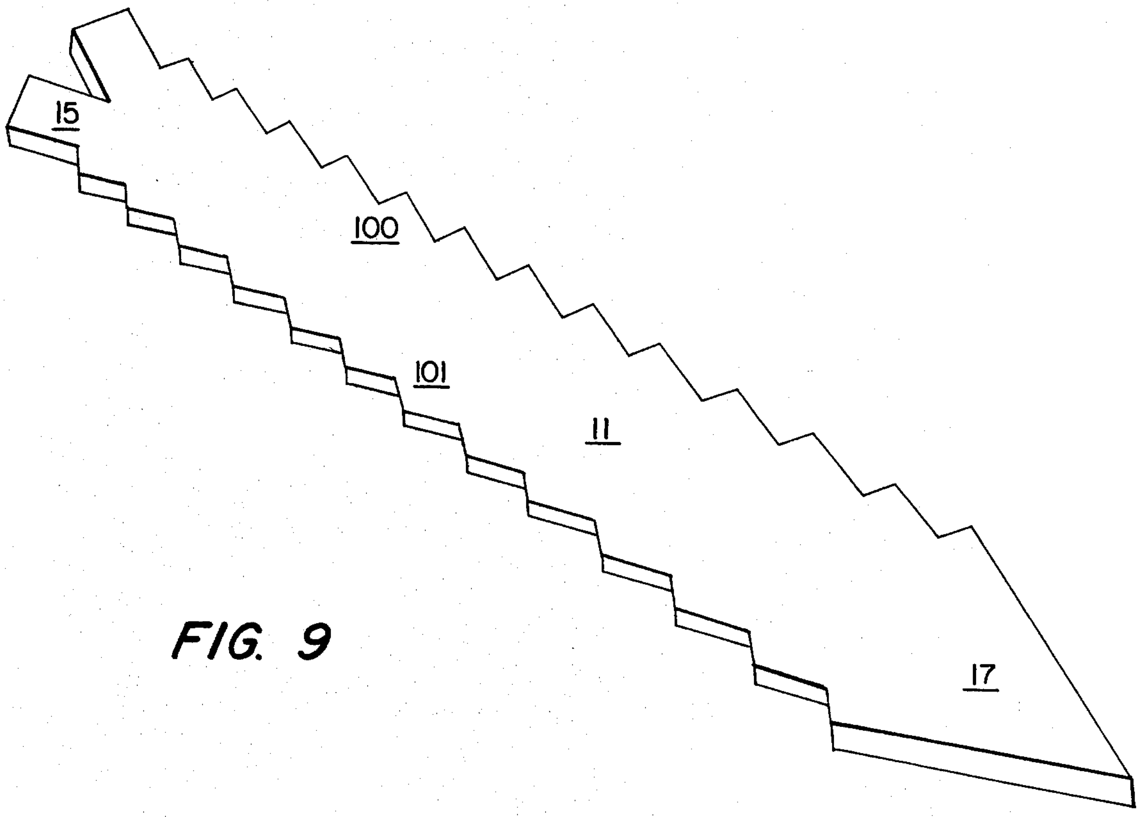
FIG. 9 of the drawings is an axonometric projection of one preferred embodiment of the present invention, a serriform thin magnetic film strip, in its entirety.

Refer now to FIG. 9, where an axonometric projection of the surface of a thin magnetic film strip 11 with denticulated margins 100, 101 is shown in the entirety of its length. Oblong strip 11 terminates at one extremity with an aculeate prow 17 and at the other extremity with a homocercal tail 15. An acute intersection at the centerline aligned with an oblong axis of strip 11 of the edges of prow 17 and tail 15 effectively positions both ends of domain wall core 1 at the centerline. An approximately equal distribution of surface area and therefore, an equality between the magnitudes of oppositely directed local easy or oblong axis magnetic fields in prow 17 and tail 15, confines the formation of the core of the domain wall to a readily ascertained location along the center of strip 11. Normal symmetry of parallel, denticulated margins 100, 101 similarly controls the location of the core section of the domain wall (not shown), thereby providing for its alignment with the extremities of the strip 11, thus providing a relatively straight domain wall core between the apex of prow 17 and the notch of tail 15.

Figure 10A:
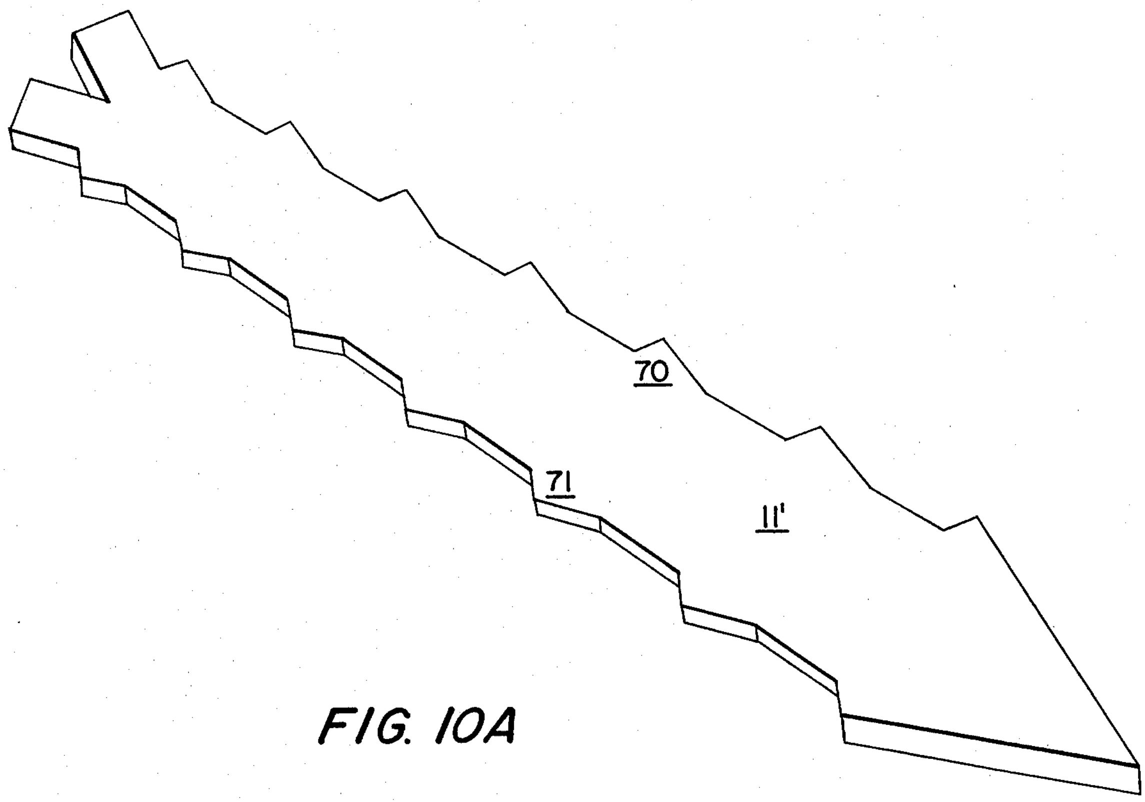
FIG. 10A of the drawings shows an axonometric view of an alternative embodiment of a serriform thin-film strip memory according to the present invention.
Figure 10B:
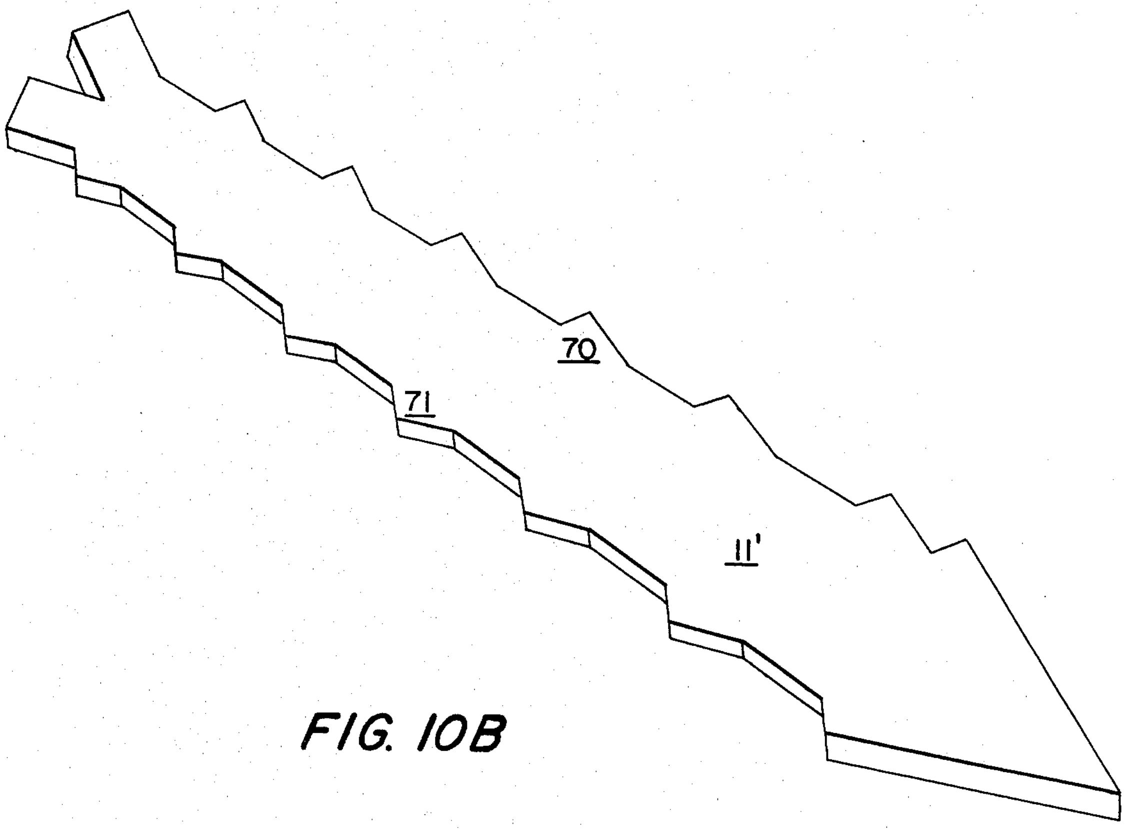
FIG. 10B of the drawings shows an axonometric view of an alternative embodiment of a serriform thin-film strip memory according to the present invention.
Figure 10C:
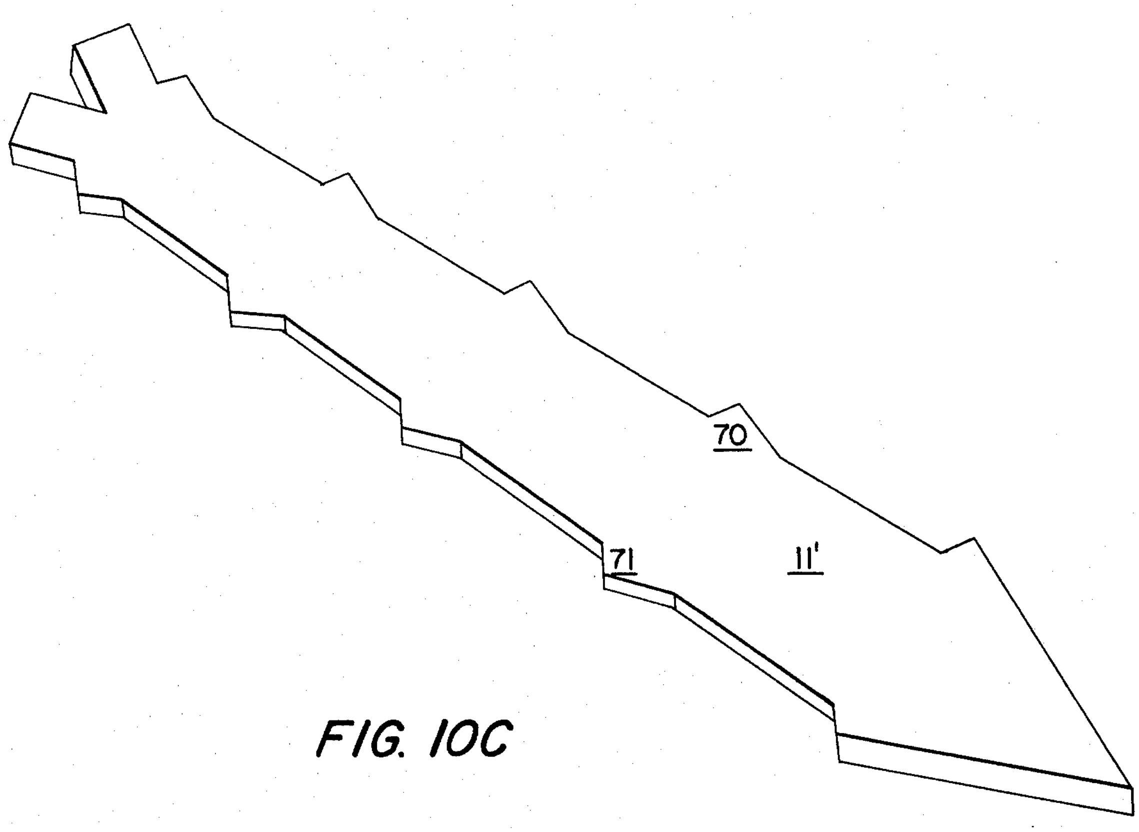
FIG. 10C of the drawings shows an axonometric view of an alternative embodiment of a serriform thin-film strip memory according to the present invention.
Figure 10D:
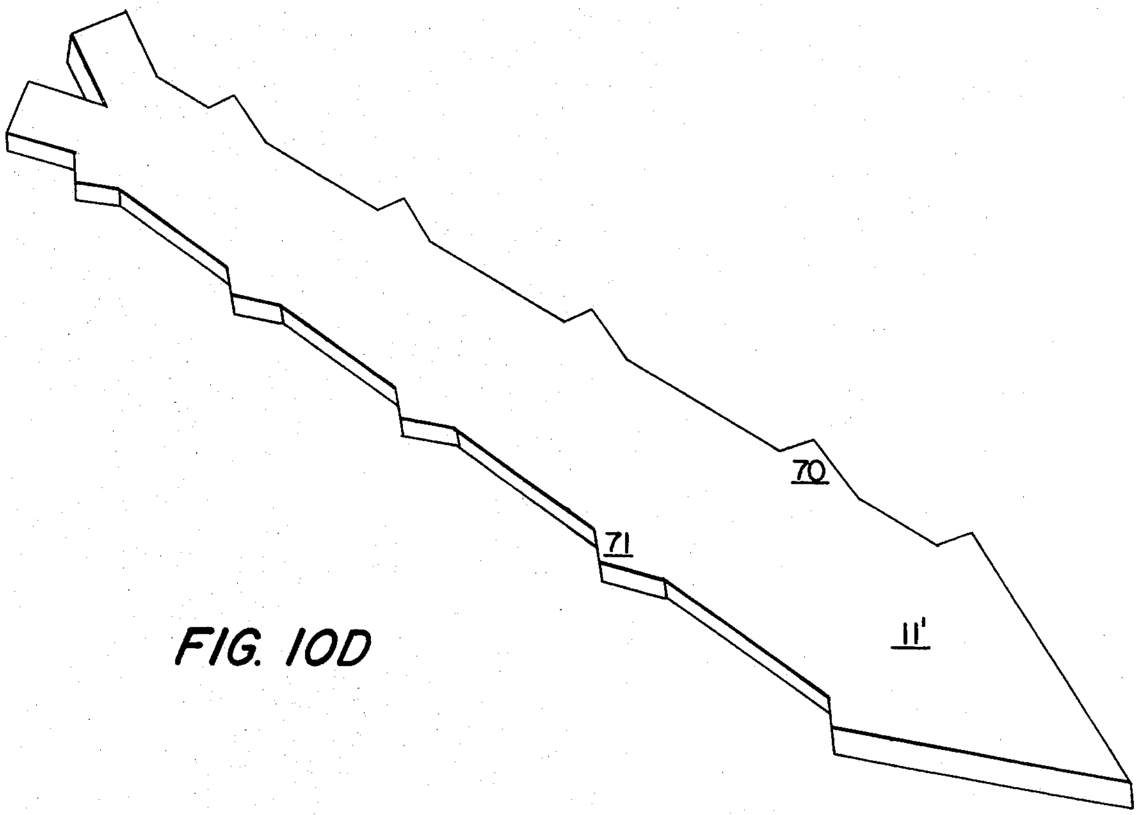
FIG. 10D of the drawings shows an axonometric view of an alternative embodiment of a serriform thin-film strip memory according to the present invention.

The serriform thin-film strip discussed in detail in the foregoing paragraphs is generally described as having incised serrate margins running parallel to its oblong axis with the margins formed by abutting jugate denticles, as is illustrated by FIG. 9 of the drawings. It should be apparent that in practicing the present invention however, that three considerations influence the fabrication of a thin-film strip according to the foregoing teachings. The geometric conformity of each denticle to inequality (3) assures a predictable edge effect upon the local magnetization. The near identity of the direction of orientation of all denticles in both oblong margins permits cooperative addition of edge effects local to each denticle resulting in formation of a single domain wall extending the length of the strip. The spaced denticulation of individual denticles along each margin in respect to the directly and obliquely opposite denticles of the parallel margin controls the accurate location of the core of the domain wall along the oblong axis or centerline of the strip. Accordingly, a thin-film crosstie memory strip having margins formed of a plurality of similarly oriented denticles geometrically conforming to inequality (3) may have a precisely positioned domain wall core even though the denticles in each margin are not abutting or the denticles in opposite margins are not jugate. Referring to FIG. 10A of the drawings a serriform thin-film strip 11' is shown having non-abutting, jugate denticles. Along each margin each denticle 70, 71 is spaced apart from its adjacent denticles by a length equal to the length of its base. FIG. 10B of the drawings shows a serriform thin-film strip 11' having non-abutting denticles arranged along opposite edges of the strip in an alternate or non-jugate sequence. As in the strip shown in FIG. 10A, each denticle 70, 71 is spaced from its adjacent denticles by a length equal to the length of its base. Thus, in the strips shown in FIGS. 10A and 10B if each denticle has a 10 baselength, the apices of adjacent denticles along each margin will be 20 microns apart. In FIG. 10C of the drawings, serriform thin-film strip 11 has serriform ablong margins formed with non-abutting, jugate denticles spaced apart from adjacent denticles by a length equal to two baselengths. FIG. 10D of the drawings shows a thin-film strip 11' having serriform ablong margins formed with non-abutting denticles arranged in an alternate or non-jugate (i.e., staggered) sequence. Each denticle is spaced apart from adjacent denticles in the same marging by a length equal to twice the length of its base. Thus, in the thin-film strips shown in FIGS. 10C and 10D if each denticle has a 10 micron baselength, the apices of adjacent denticles will be 30 microns apart. The spacing of non-abutting denticles is ordered rather than random, in correspondence with the accompanying propagation and detection scheme.

The serrated margins simplify production of the thin permalloy strips by permitting the use of conventional mask aligners. A fresh film of polycrystalline nickel-iron is prepared under vacuum on a glass or silicon dioxide substrate in the presence of a uniform magnetic field. An easy axis for the magnetization arises from the magnetic field during deposition, and is normally chosen parallel to the longest side of the element. The crystalline size is on the order of the film thickness. These crystallites are face-centered cubic, exhibit a certain crystalline anisotropy, and are tightly coupled by exchange coupling and magnetostatic coupling. Fresh films are susceptible to scratching. After several hours of exposure to air the films become quite scratch resistant, presumably due to an oxide formation. The mechanical integrity of the films is good and introduces little constraint upon microelectronic assembly procedures except that of adequately aging the film surface. The oxide layer appears to lessen the vulnerability of the film to various chemicals. Fresh films are vulnerable to a variety of aqueous solutions while aged films are more durable. Chemical constraints upon a microelectronic assembly are numerous in order to preserve the film's surface, its bulk, and the supporting material.

Figure 11A:
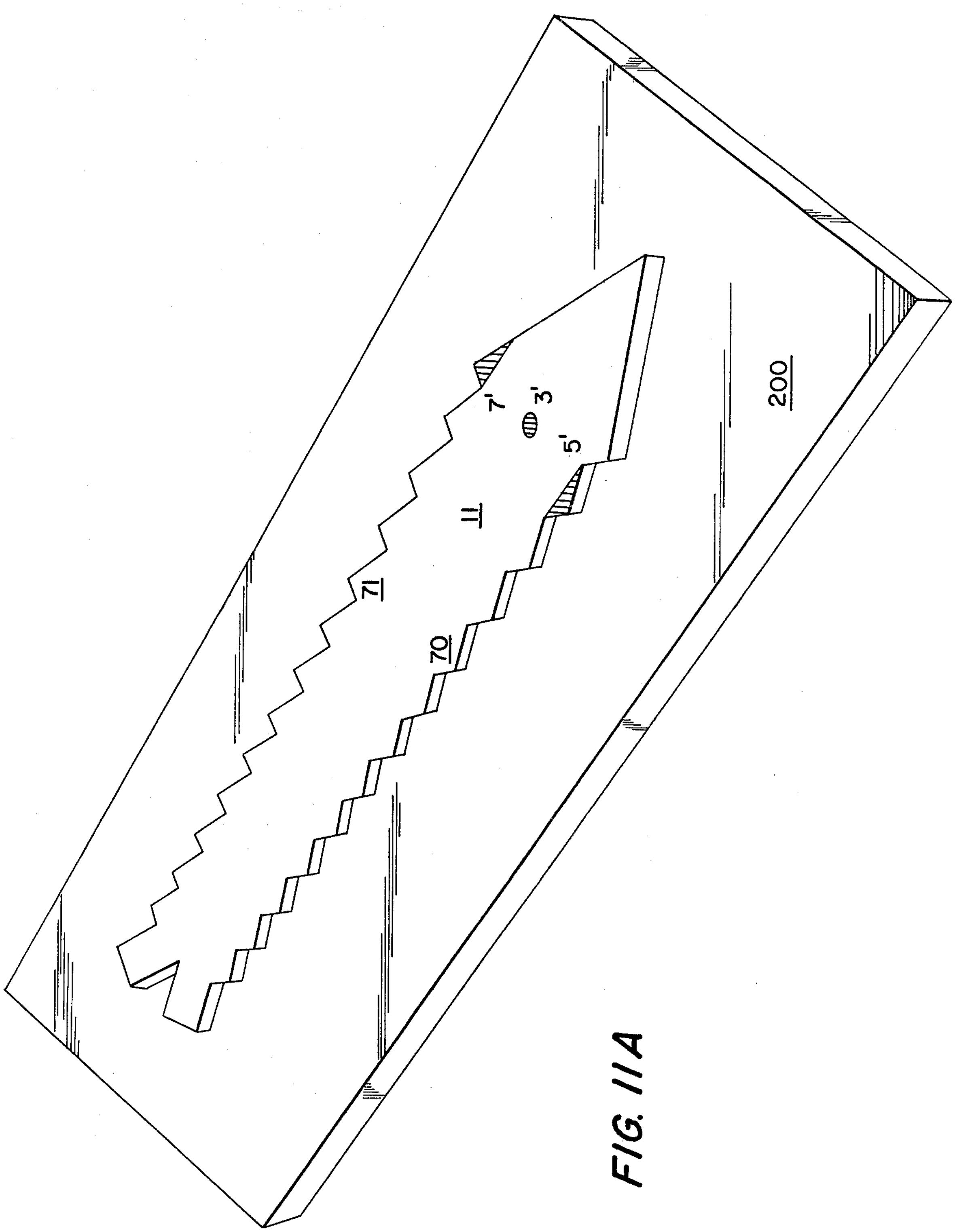
FIG. 11A of the drawings shows in an axonometric view a serriform thin-film strip memory deposed above a substrate layer.
Figure 11B:
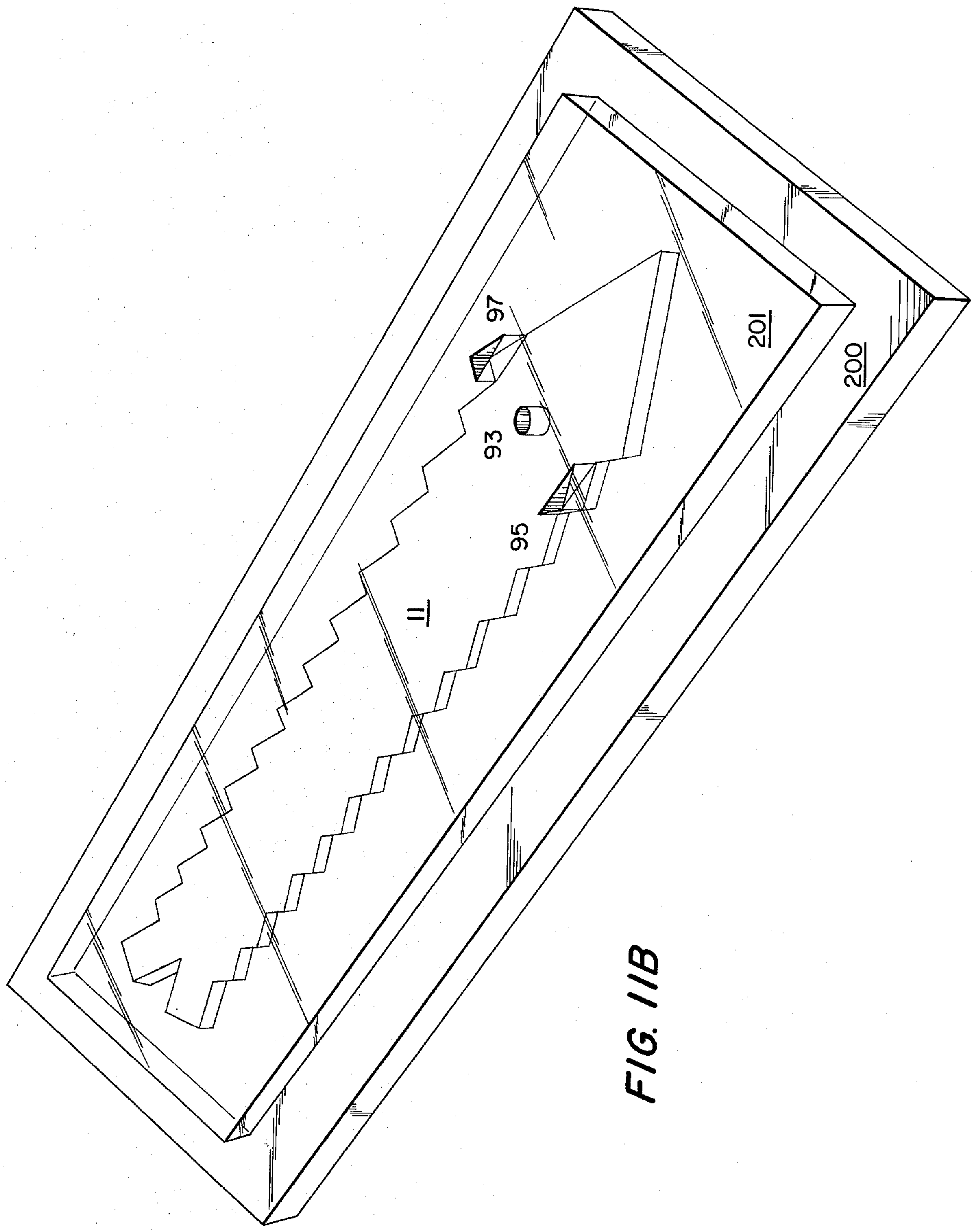
FIG. 11B of the drawings shows in an axonometric view of the serriform thin-film strip memory of FIG. 11A over which a dielectric insulative layer has been placed.
Figure 11C:
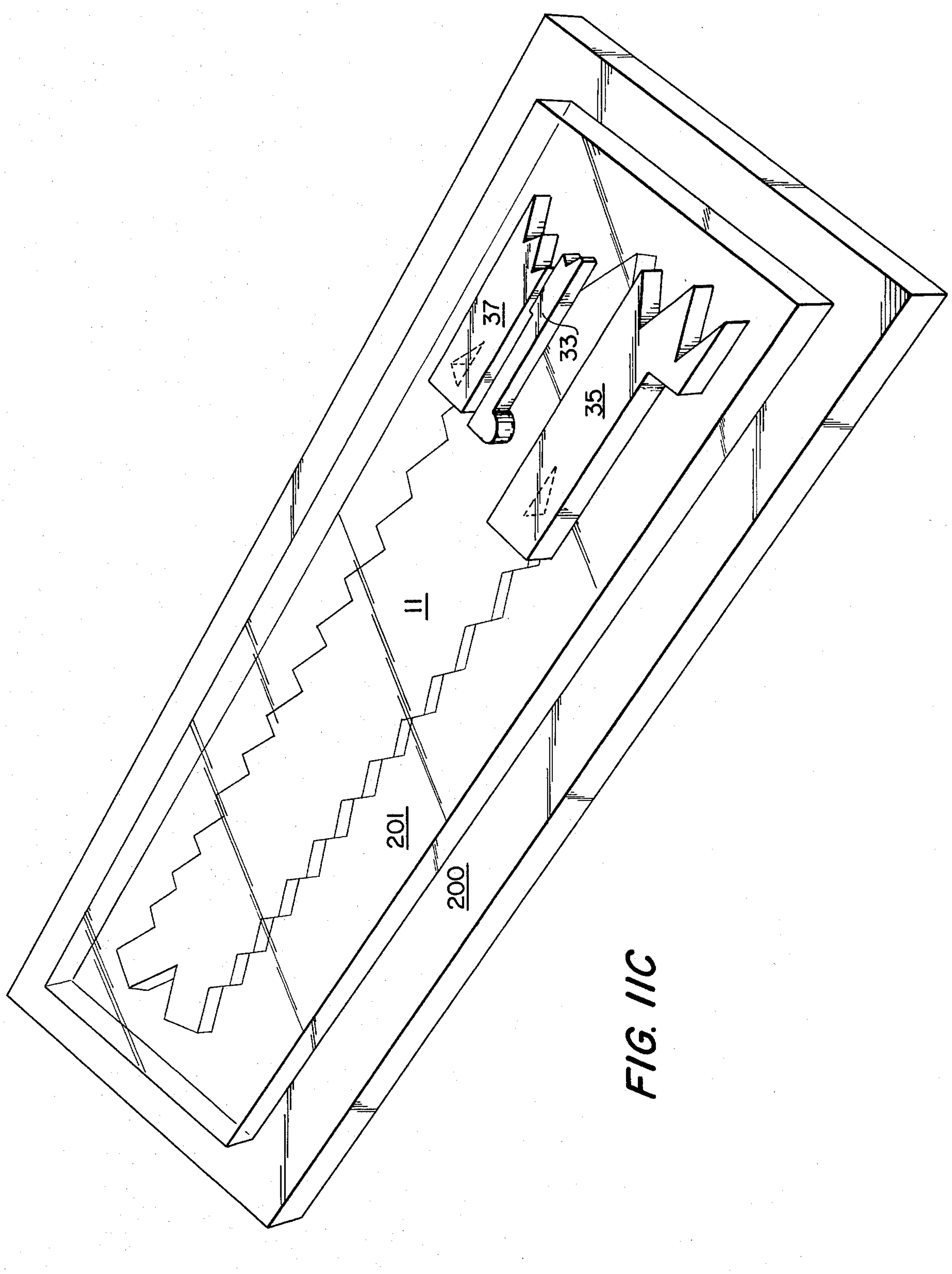
FIG. 11C of the drawings shows in an axonometric view the serriform thin-film strip memory of FIG. 11B upon which the external connection to the nucleation, propagation, and detection circuitry has been deposited.

One or more masks are generated and the permalloy film of uniform thickness is etched, either directly or by reverse etching (i.e., lift-off), leaving one or more strips 11 of the film as shown in FIG. 11A of the drawings with the parallel serrated margins aligned along the oblong axis of the film. A layer 201 of insulative material such as SiO or $SiO_2$ is deposited on the serrated strips as shown in FIG. 11B of the drawings except in selected areas or regions 93, 95, 97 where detector circuit contacts may be connected. Chrome, and then gold are next deposited on layer 201 and etched to form the conductors 33, 35, 37 shown in FIG. 11C, for coupling contact regions 3, 5, 7 respectively to the external components of the detector circuits. Obviously, the length, and therefore the information capacity of the thin-film memory strips fabricated in this manner may be tailored to requirements of the user. A 32 memory cell or bit strip may satisfy one application while a 1024 bit strip (or an array of 1024 bit strips) may be required by a subsequent application.

SHIFT REGISTER OPERATION

A fast magnetic pulse of one to ten nanoseconds applied along one traverse axis of the film strips will nucleate crosstie-Bloch line pairs at the point where domain wall core 1 is transversed by the magnetic field (not shown). In general, two pulses are needed to propagate a bit from one serration or memory cell to the next. The Bloch line is moved forward, an intermediate Bloch line-crosstie pair is nucleated between the existing crosstie-Bloch line pair, and the Bloch line and now trailing crosstie are annihilated. The pulse intended to propel the existing Bloch line forward must be limited in amplitude to avoid the nucleation of crossties where their absence is desired. The force exerted by the propulsion pulse however, must be greater than the restraining force exerted by the potential well in which the Bloch line rests.

Figure 12:
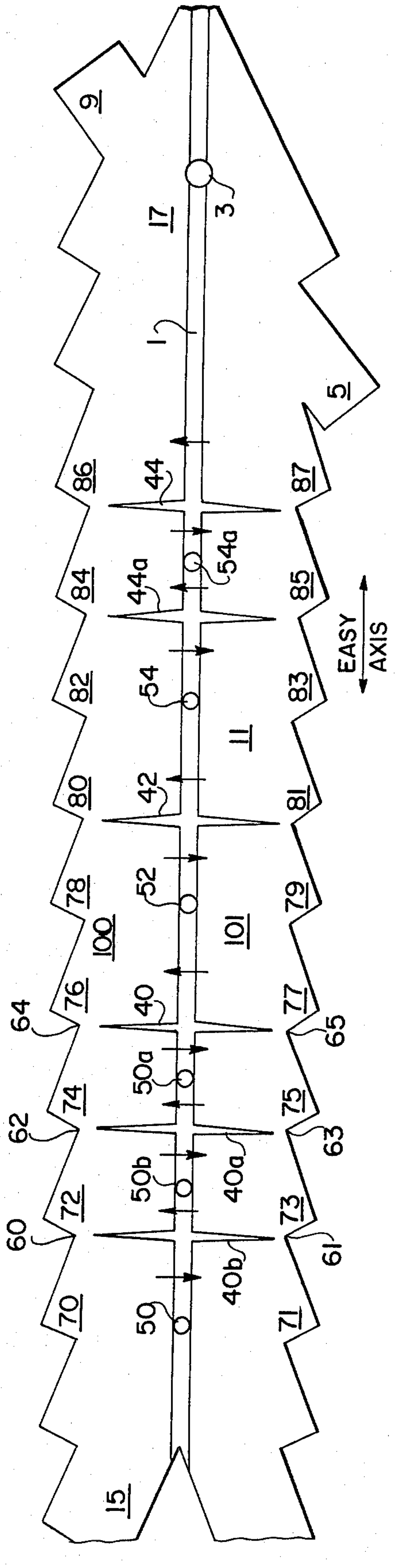
FIG. 12 of the drawings shows a top view of a serriform thin magnetic film strip memory upon which a domain wall core has been superimposed.

Referring now to FIG. 12, a top view of the surface of a thin magnetic film strip 11 with denticulated margins 100, 101 is shown in the entirety of its length with a superimposed domain wall core 1. Oblong strip 11 terminates at one extremity with an aculeate prow 17 and at the other extremity with a homocercal tail 15. The acute intersection at a centerline aligned with an oblong axis of strip 11, of the edges of prow 17 and tail 15 effectively positions both ends of domain wall core 1 at the centerline. An approximately equal distribution of surface area and therefore, an equality between the magnitudes of oppositely directed local easy or oblong axis magnetic fields in prow 17 and tail 15, confines the formation of the core of the domain wall to a readily ascertainable location along the center of strip 11. Normal symmetry of parallel, denticulated margins 100, 101 similarly controls the location of the core section 1 of domain wall 16, thereby providing for its alignment with the extremities of strip 11, thus providing a relatively straight domain wall between the apex of prow 17 and the notch of tail 15.

A serriform thin magnetic film strip having a pair of margins paralleling its length and denticulated in the manner set forth above, is adaptable for use as a serial access shift register. Propagation may be effected in either direction along domain wall 16, but the better technique is to propagate from tail to prow. For annihilation of Block line-crosstie pairs, the required magnitude of the magnetic pulse is greater than the magnitude required for nucleation. By electing to propagate Bloch line-crosstie pairs along the domain wall core 1 from the tail 15 to the prow 17, the large annihiliation pulse is applied in the same direction as the initial magnetic pulse used to form the domain wall. After formation of domain wall 16, information may be entered at the tail 15 of strip 11 by applying a nucleate pulse via a short electrical conductor overlying only the center of tail 15 to the area between the neck joining the tail 15 with the leftmost pair of opposed denticles. A crosstie forms at the terminal of wall 16 in the notch of tail 15, and a Bloch line forms between the leftmost pair of necks just to the right of the crosstie. A local conductor may be used to apply a field so as to push the Bloch line into the first potential well between the apieces of the leftmost pair of opposed denticles. A Bloch line in the first potential well may be taken as indicating that the first memory cell of the thin-film strip shift register 11 contains a logical ONE while an empty well (i.e., the Bloch line remaining next to the crosstie), may be taken as indicating that the first memory cell contains a logical ZERO. Once the Bloch lines enter the next potential well, the propagation conductor takes over and steps a ONE from cell to cell along the domain wall 16 of the thin-film strip shift register. Detection of the presence of a Bloch line-crosstie pair along strip 11 (i.e., reading the contents of a serial access shift register) is more completely discussed in a copending application Ser. No. 720,295, Magnetoresistance Detector For Crosstie Memories, L. J. Schwee, H. R. Irons, W. E. Anderson, K. P. Scharnhorst, and A. D. Krall, Navy Case No. 59,907, which issued as U.S. Pat. No. 4,100,609 on July 11, 1978.

In light of the foregoing teachings it is apparent that the shape of the thin magnetic film strip influences the properties of the strip. By way of illustration, the propagation characteristics in terms of the field strength required for the denominated functions for a large, unetched thin-film sheet (i.e., an infinite plane), and two serriform film strips having distances between opposite apices (i.e., widths) of 25 microns and 10 microns respectively, are tabulated in Table 1. All films have a 350 Å thickness, and all field strengths are in Oerstads.

TABLE I

| Type of Film | Wall Placement Field | Crosstie Nucleate Field | Bloch Line Movement Field | Crosstie Annihilate Field |
|---|---|---|---|---|
| Unetched | 4 | 0.8 | 0.1 | 1.6 |
| 25 micron | 80 | 2.3 | 1.0 | 6.5 |
| 10 micron | ≈500 | 7.5 | 6.2 | 19.0 |

The strength of the field required to form the domain wall, nucleate crossties, move a Bloch line, and annihilate a crosstie is dependent upon the width of the film strip. In the unetched film sheet, Bloch line movement along the domain wall requires the coercive force of a 0.1 Oe. magnetic field. After a thin-film sheet is etched into serrated strips, the magnitude of the required coercive force remains the same but, the presence of potential wells and the demagnetizing effects of the strip require an increase in the strength of the applied field in order to force a Bloch line either along the wall or into a neighboring well. The magnitude of the field strength required to move a Bloch line along a wall differs slightly depending upon the direction in which movement is desired. The magnitude of the field strength required to nucleate and annihilate crosstie-Bloch line pairs differs slightly, depending upon whether a positive or a negative traverse axis field is applied. These differences in magnetic field strengths are small and only average values are given in Table I.

An oblong axis field of up to 2.0 Oersteds which corresponds to the typical coercive force required for wall movement, can be applied to a strip before its domain wall will begin to move. If the margins of the strip are smooth, an oblong axis field of approximately 10 Oerstads can be applied to a strip before its domain wall is forced to the edge of a margin. While the magnetic properties of a twenty-five micron wide film strip permit the use of power for domain wall formation and Bloch line propagation, the ten micron wide film strip inherently provides greater certainty in domain wall placement and greater memory compactedness (i.e., bit density). The demagnetizing effects of neighboring film strips in an array of strips fabricated on a single chip however, limit the bit density available in a multistrip arrangement.

An applied magnetic field as seen by the thin-film strip is modified by the demagnetizing factors of the strip. For example, from Table I it can be seen that a twenty-five micron wide serriform strip requires magnetic field strengths approximately 3.5 times the magnitude of the magnetic fields required for nucleation and annihilation in an infinite plane sheet of the same thickness. This suggests that although a potential well is only 0.3 Oersteds deep, a one Oersted field is required to dislodge a Bloch line from its potential well. The values set forth in TABLE I are static values; pulses of shorter duration require an increased amplitude. From FIG. 5 it can be seen that the nucleation field required for an infinitely wide sheet of 350 Å thickness using a ten nanosecond pulse has an amplitude of approximately 2.5 Oerstads. A ten nanosecond pulse may have an amplitude up to approximately 8.75 Oersteds before nucleation will occur in a twenty-five micron wide serriform strip. If a 6.0 Oersted field is applied to propel a Bloch line, the force felt by the Bloch line is that of a 1.7 Oerstad field. If the magnitude of an applied field is sufficient to dislodge a Bloch line from its potential well, the well impedes Bloch line motion until the Bloch line clears the hump; thereafter, the well aids the Bloch line motion. The presence of a potential well may therefore be neglected in estimating the total distance that a Bloch line will travel if it is able to clear the "hump". For example, if the denticles have a base length (i.e., the distance along the oblong axis between successive indents or apices) of eight microns, a Bloch line must travel approximately eight microns to move to the next memory cell. Considering the Block line mobility of 48,000 centimeters per Oersted-second, a 10 nanosecond pulse 1.7 Oersteds in amplitude will easily allow a Bloch line to clear the "hump" and travel a distance of approximately 8.2 microns. It is difficult to perform this experiment with a Bitter solution thick enough to permit observation of the Bloch line as the solution carries its own field which is strong enough to return a Bloch line to its original location upon termination of a pulse. Annihilation pulses indicate that Bloch lines can move at speeds up to 153,000 centimeters per second. To annihilate a trailing crosstie-Bloch line pair, a ten nanosecond pulse about fifteen Oersteds in amplitude is required.

The 10 nanosecond propulsion and annihilation pulses must be repeated twice in order to propagate a bit of information through one period of a two-period shift register. The necessity of providing a relaxation interval between successive pulses extends the time required for each shift to approximately fifty nanoseconds, a shift rate of approximately $20 \times 10^6$ bits per second. The serriform thin-film shift register is operable with larger amplitude pulses of shorter duration if an increased shift rate is desired. It is necessary however, to minimize the demagnetizing effects in order to minimize the amount of power required for operation of the serriform strip shift register.

SINGLE CONDUCTOR PROPAGATION

Figure 13A:
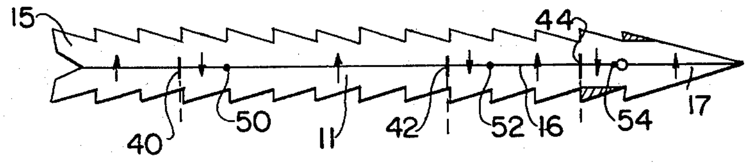
FIG. 13A of the drawings shows a thin magnetic film strip populated with a plurality of crosstie-Bloch line pairs.
Figure 13B:
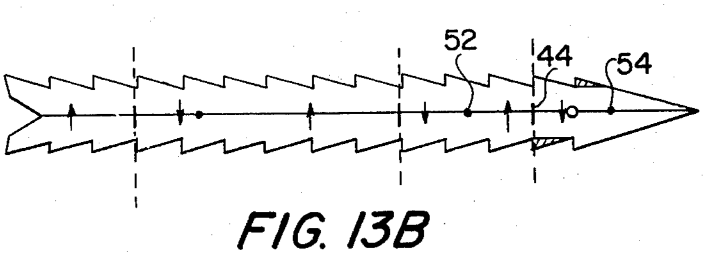
FIG. 13B of the drawings shows the thin magnetic film strip shown in FIG. 13A after application of a negative magnetic propagation pulse.
Figure 13C:
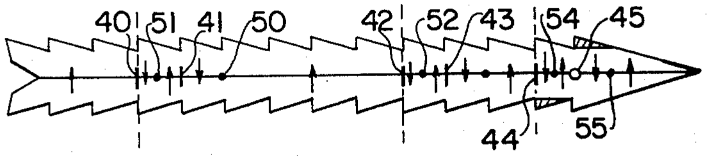
FIG. 13C of the drawings shows the thin magnetic film strip shown in FIG. 13B after application of a brief positive magnetic nucleation pulse.
Figure 13D:
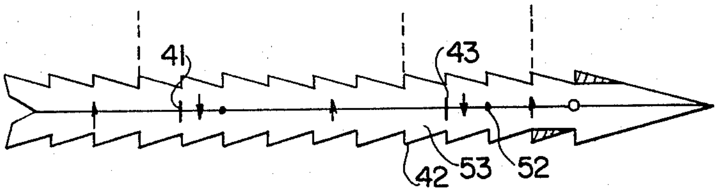
FIG. 13D of the drawings shows the thin magnetic film strip shown in FIG. 13C after application of a positive magnetic annihilation pulse.

Referring now to FIGS. 13A, 13B, 13C, and 13D wherein there is shown a series of thin magnetic film strips 11 having parallel serriform margins symmetric about an imaginary centerline running the length of the strip, a homocercal tail 15, and a aculeate prow 17. Each film strip illustrates a successive step in a three step, single conductor scheme for propagating information along the domain wall. A domain wall 16 is formed with its core 1 positioned between the notch of tail 15 and the apex of prow 17, running the length of strip 11. The crossties 40, 42, 44 and Bloch lines 50, 52, 54, have preferred locations along the domain wall 16 between the apices of opposite denticles respectively. Bloch lines 50, 52, 54, however, are displaced to the right of their usual equilibrium positions in their potential wells at the necks between apices by the repulsive force of their neighboring crossties 40, 42, 44. A single electrical conductor (not shown) separated by an electric ally insulative layer (e.g., SiO, $SiO_2$) from the surface and running along the length of strip 11 is used to provide positive and negative magnetic pulses along the hard axis of film strip 11. FIG. 13A has three crossBloch line pairs, 40–50, 42–52, 44–54. Applicacation to a thin-film strip 11 having the crosstie-Bloch line arrangement of FIG. 13A, of a negative magnetic pulse via the electrical conductor along the negative hard axis with sufficient magnitude will move the Bloch lines 50, 52, 54 to the right and into the next potential wells along the core 1 of the domain wall, as shown by FIG. 13B. After a brief interval, a magnetic pulse of shorter duration but greater magnitude-sufficient to nucleate a crosstie-Bloch line pair-is applied via the electrical conductor along the positive traverse axis of strip 11 of FIG. 13B. As shown by FIG. 13C, new Bloch line-crosstie pairs 51–41, 53–43, 55–45 are nucleated between existing crosstie-Bloch line pairs 40–50, 42–52, 44–54 respectively. Through their repulsive force, each new crosstie 41, 43 displaces to the right its leading (i.e., previously existing) Bloch line 50, 52, 54 respectively. Third, a magnetic pulse of the same magnitude but of greater duration known as an annihilation pulse, is applied along the positive or upward traverse axis of the thin-film strip 11 of FIG. 13C. As they are at equilibrium in their corresponding potential wells, the trailing (i.e., new) Bloch line 51, 53, 55 are closer to the trailing (i.e., previously existing) crosstie 40, 42, 44 respectively. With a mobility of approximately 48,000 centimeters per Oerstad-seconds, the trailing Bloch line 51, 53, 55 has enough time during the duration of the annihilation pulse to travel to the left along the core 1 of the domain wall and reach the trailing crosstie 40, 42, 44. The leading Bloch lines 50, 52, having been displaced to the right of their potential wells, lack sufficient time during the duration of the annihilation pulse to reach their corresponding leading crossties 41, 43. Additionally, the repulsive force on the trailing Bloch lines 5, 53 from the lead crossties 41, 43 cancels part of the repulsive force from the trailing crossties 40, 42 so that a smaller annihilation field is required to force the trailing Bloch lines 51, 53 into their corresponding trailing crossties 40, 42. Consequently, an annhilation pulse applied along the positive traverse axis of strip 11 of FIG. 13C will, as is shown in FIG. 13D, if of sufficient amplitude to move a trailing Bloch line, sufficient duration to allow the trailing Bloch line to reach the corresponding trailing crosstie, but of insufficient duration to allow a leading Bloch line to reach the corresponding leading crosstie, cause annihilation of the trailing crosstie-Bloch line pairs 40–51, 42–53, without annihilating the lead crosstie-Bloch line pairs 41–50, 43–52. The net result of the foregoing three pulse propagation scheme is, in effect, the propagation of each crosstie-Bloch line pair by one denticle or memory cell of the thin-film strip shift register 11.

In a variation of this propagation scheme, the low amplitude, short duration, nucleating pulse applied along the positive traverse or hard axis is eliminated and the leading edge of the annihilation pulse nucleates new crosstie-Bloch lines pairs between existing crossties-Bloch line pairs. In this scheme each leading Bloch line is moved to the right, away from its corresponding crosstie by the low amplitude pulse along the negative traverse or hard axis of film strip 11; an intervening Bloch line-crosstie pair is nucleated between each existing crosstie-Bloch line pair by the leading edge of a high amplitude pulse applied along the positive traverse or hard axis of film strip 11; and, each trailing (i.e., the original) crosstie and each trailing (i.e., the intervening) Bloch line pair is annihilated during the duration of the annihilation pulse. As only two pulses are needed to step the binary bits of information from cell to cell along the domain wall of the thin film strip register 11, a more rapid, single line propagation is achieved with less energy. It has been found that this two pulse propagation scheme is particularly useful when the strip shift register has a twenty-five micron width between opposite apices.

Figure 14:
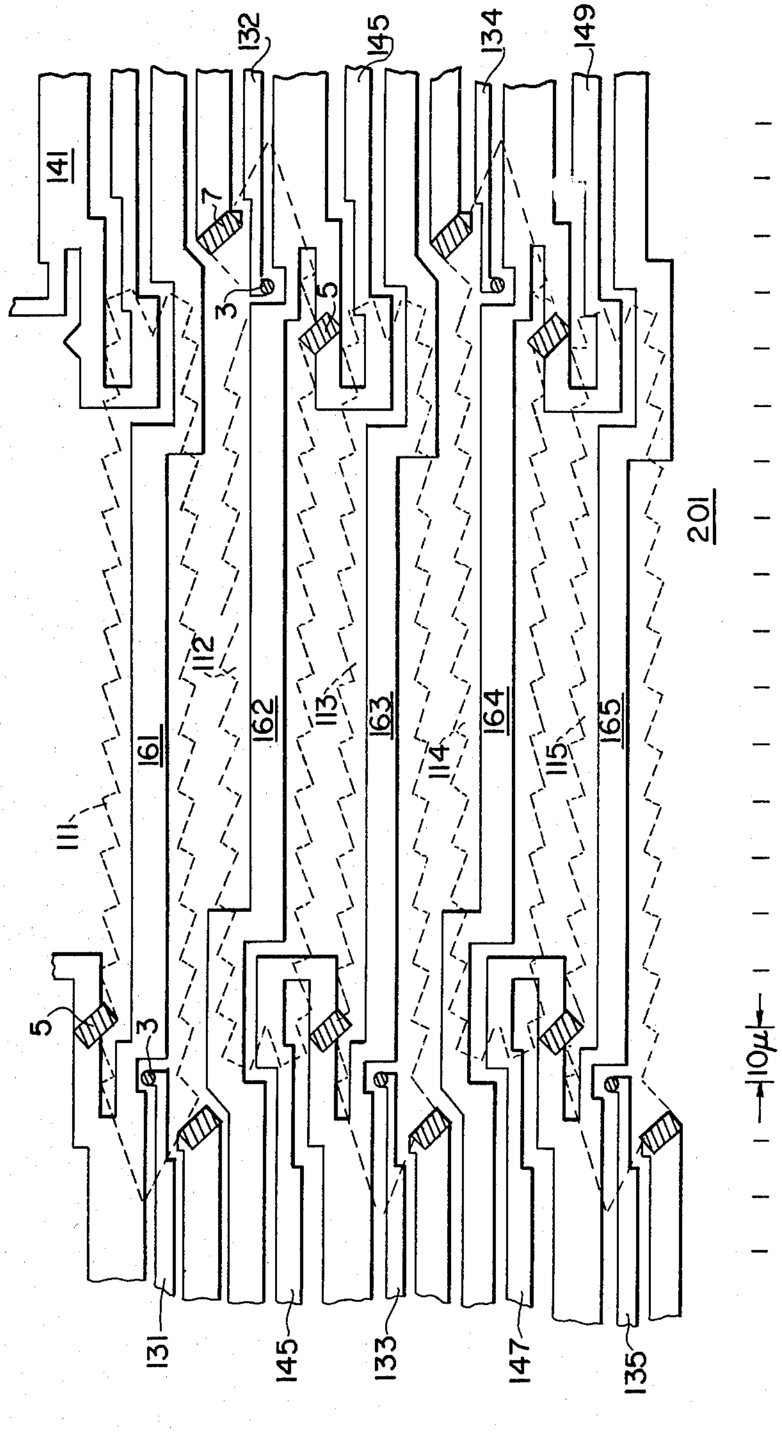
FIG. 14 of the drawings is a top view of a stand-alone array of serriform thin magnetic film strips with overlain nucleatepropagate, and detector electrical conducts.

Referring now to FIG. 14 there is shown a top view of a segment of a stand-along crosstie memory array susceptible to single conductor propagation of Bloch line-crosstie pairs. Five serriform thin-film memory strips 111, 112, 113, 114, 115 are covered by a dielectric insulating layer 201. Drive or propagate electrical conductors 161, 162, 163, 164, 165 and nucleate electrical conductors 141, 143, 145, 147, 149, are placed on the exposed surface of layer 201 and spaced-apart in an arranged sequence with respect to the corresponding strip 111, 112, 113, 114, 115 respectively, running from the first set of memory cells following the memory cell adjoining the homecercal tail of the strip to the detector sense contact 3. After passing the detector sense contact 3, each propagation conductor (e.g., 162) of one strip 112 passes over the notch of the homecercal tail as a nucleate conductor (e.g., 145) of an adjacent strip 163. Prior to reaching the notch of the adjacent strip 163 however, the propagation conductor passes over and is electrically coupled to one terminal 5 of the detector circuit. An electrically isolated conductor 131–135 is electrically coupled to the detector circuits voltage sensor contact 3 in each of the five strips 111–115 shown. The detector circuit is more fully described in copending U.S. application, Ser. No. 720,295, Navy Case No. 59,907, supra.

The repulsive force exerted by a crosstie on a Bloch line is an important force in single conductor propagation. For reliable operation, the potential well of a Bloch line should be no more than approximately four microns distant from its corresponding crosstie. Therefore, the length of the base of each denticle (i.e., the distance between successive indents) should be no more than approximately eight microns. In order to minimize interference between adjacent bits, no more than one bit should be stored in any three adjoining memory cells, thereby making the period of a thin-film, serriform strip shift register approximately twenty-four microns in length. A pulse propagation scheme would have to be repeated three times to move each bit through a single, three cell period. With an estimated propagation rate of forty-eight nanoseconds per period, a serriform strip shift register will have a shift rate of approximately $20\times 16^6$ bits per second. A shortened period length will allow an increased shift rate.

TWO CONDUCTOR PROPAGATION

Figure 15:
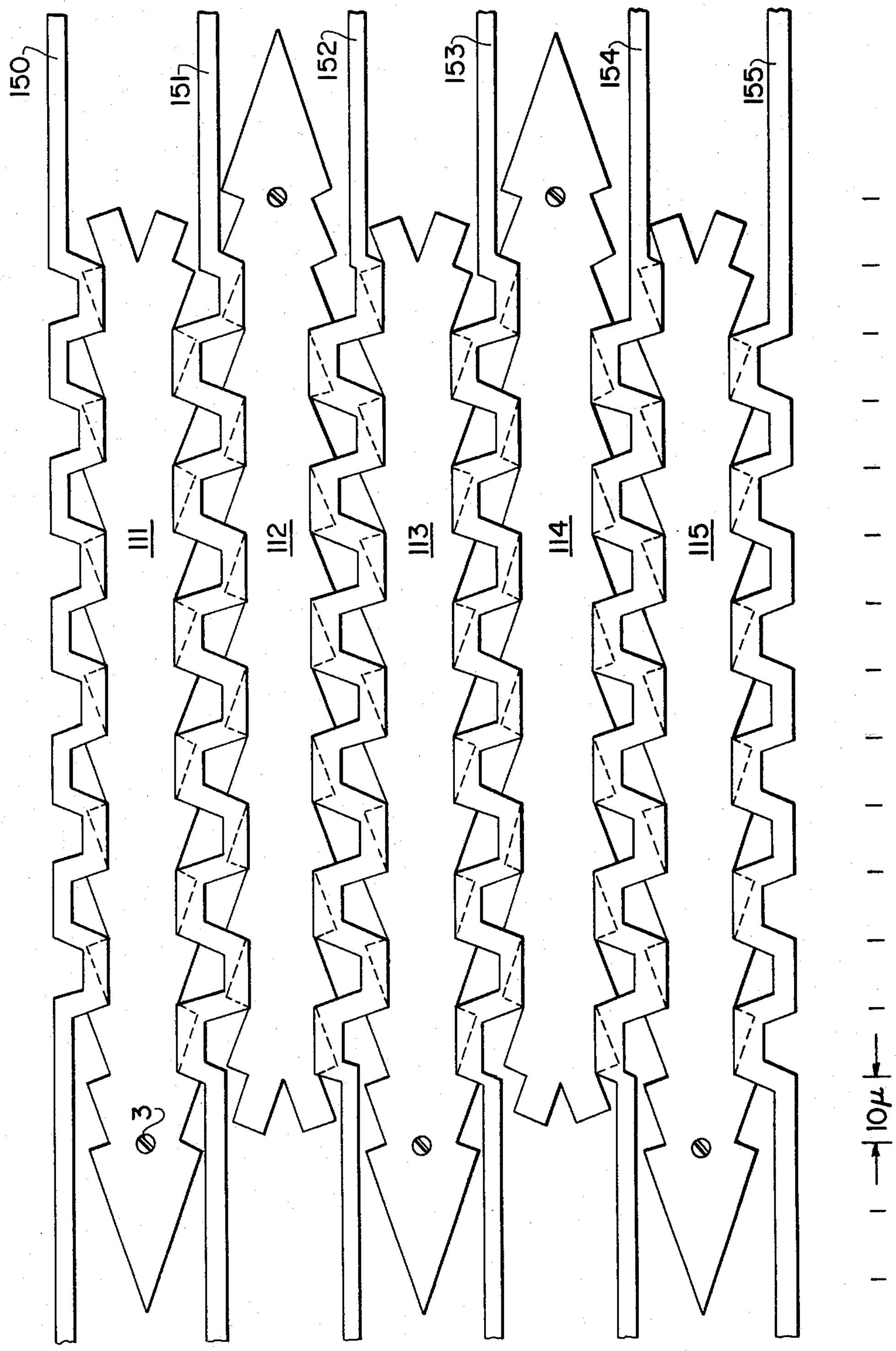
FIG. 15 of the drawings is a top view of a stand-alone array of serriform thin magnetic film strips with overlain main and auxiliary conductors.

Thin-film serriform strip shift registers are susceptible to fabrication in multi-strip arrays. Referring now to FIG. 15, there is shown a plurality of parallel complanar serriform strips 111, 112, 113, 114, 115 etched from the same thin-film, each lying in an alternate prow-to-tail array. As in the circuit shown in FIG. 14 for the single conductor propagation scheme, a single main conductor 121, 122, 123, 124, 125 runs along the centerline of each strip, 111, 112, 113, 114, 115 respectively. Crenelated auxiliary conductors 150, 151, 152, 153, 154, 155 are arranged along the margins of the outside strips and between the margins of adjacent strips so as to overlie alternate denticles of the adjacent margins. Thus, each strip has three electrical conductors: a main conductor running along the centerline, and an auxiliary conductor overlaying denticles along each margin. Only one of each pair of opposite denticles is overlain by an auxiliary conductor. The conductors are coplanar as no crossover is required, and are separated from the thin film by an electrically insulating layer (e.g., SiO, $SiO_2$). As the two auxiliary conductors are shared with the two adjacent strips, 2n+1 conductors are required if there are n strip shift registers. The first two steps in a double conductor propagation scheme are the same as the first two steps of the three-step single conductor propagation scheme. In this scheme however, the repulsive force exerted by the crosstie upon the neighboring Bloch line is not essential to the operation. Application of a negative magnetic pulse of sufficient magnitude to a thin film strip 111 via main conductor 121 will move the Bloch lines to the right and into potential wells along the domain wall (not shown). After a brief interval, a magnetic pulse of shorter duration but greater magnitude is applied via main conductor 121 along the positive hard axis of strip 111. New crosstie-Bloch line pairs are nucleated between existing crosstie-Bloch line pairs. Through their repulsive force, each new crosstie displaces to the right its leading (i.e., previously existing) Bloch line. In the third step, direct currents of selected directions are introduced into auxiliary conductors 150, 151 to create a local magnetic field in each memory cell and thus, by exertion of a coercive force on any Bloch line within a cell, either displacing that Bloch line to the left or right of its corresponding well, or restraining that Bloch line in its potential well (e.g., a trailing Bloch line), or forcing a displaced Bloch line back into its potential well (e.g., a leading Bloch line), depending upon which denticle of the residence memory cell is overlapped by an auxiliary conductor and the direction of current running through that auxiliary conductor. In the single conductor propagation scheme, the repulsive force between each crosstie-Bloch line pair serves this function in part by displacing the leading Bloch line from its potential well. Subsequently, the annihilation pulse, a magnetic pulse along the positive hard axis of strip 111, is applied via main conductor 121 to strip 111. Those Bloch lines at equilibrium within their potential wells, absent a restraining force due to a current through an auxiliary conductor, and those Bloch lines displaced to the left of their potential wells, are forced along the domain wall to their corresponding crossties. The selective introduction of direct current through auxiliary conductors 150, 151 allows selective annihilation of crosstie-Bloch line pairs.

The foregoing description of a two conductor propagation scheme as applied to thin-film strip 111 is also descriptive of the operation of other thin-film strips 112, 113, 114, 115 in the array if consideration is given to the orientation of the particular strip with respect to the easy axis of the film and to the direction of propagation chosen for that strip. As a strip shift register operated in accordance with the two conductor propagation scheme does not rely upon the repulsive force between crosstie-Bloch line pairs to displace the leading Bloch line from its potential well, it is possible to partially ignore the restraining force exerted on a leading Bloch line by the trailing crosstie of the next binary group and use a two rather than a three memory cell period. Accordingly, the two conductor propagation scheme provides a greater bit density and thus, a faster speed of operation.

It is apparent in light of the foregoing teachings that the present invention provides an easily fabricated nonvolatile crosstie memory device adaptable for use as a shift register, and a method for propagating information from cell-to-cell along the register. The parallel serriform margins of the device permit facile and accurate placement of the domain wall in a readily ascertainable location, and thus simplify the fabrication of thin magnetic film memory strips suitable for the storage and propagation of binary information represented by the presence and absence of crosstie-Bloch line pairs along the domain wall of the strip.

Figure 16:
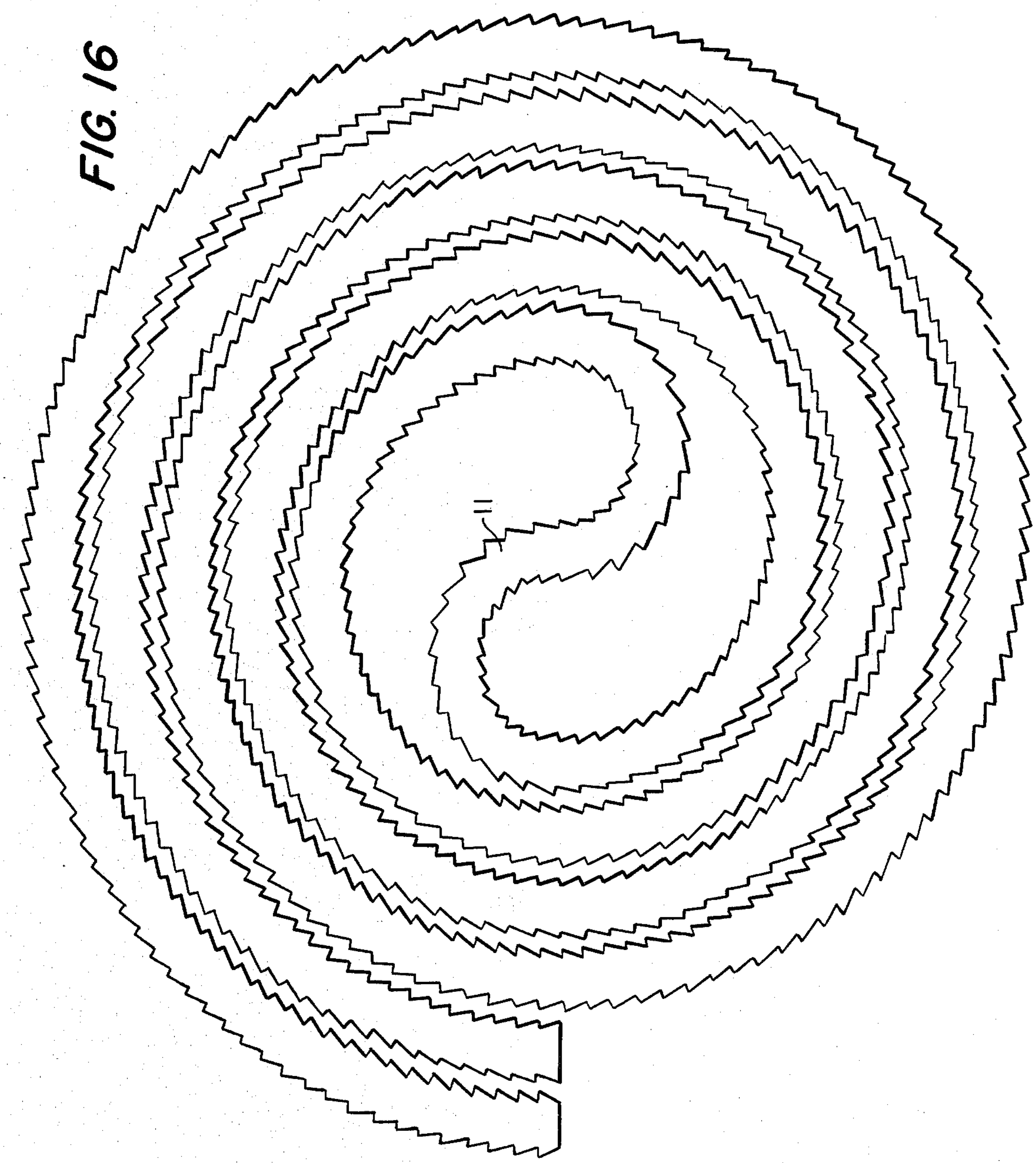
FIG. 16 of the drawings is a top view of an alternate embodiment of the present invention, a coiled, serriform thin-film strip memory.

The foregoing embodiments are merely illustrative of the basic principles of the invention. Obviously, numerous modifications and variations of the present invention are possible in light of the above teachings. For example, although FIGS. 7 through 15 show a straight serriform margined film strip, a circular, coiled, or serpentine serriform margined film strip will have an equal utility as a serially accessible shift register. FIG. 16 shows in a top view, one version of a coiled serriform crosstie memory strip.

Although the embodiments described in detail in preceding paragraphs commonly refer to the oblong axis of the thin-film as being parallel with the easy axis of the film from which it is fabricated, it should be readily apparent that in those embodiments described the cooperative edge effect upon the orientation of the magnetization overwhelms the anisotropy of the strip. In thin-film memory strips fabricated according to the teachings of the present invention there is no necessity of an alignment of the oblong axis or centerline of the strip with the easy axis of the film from which the strip is etched. Accordingly, the oblong axis of the strip may be parallel with either the easy axis, the hard axis or any intermediate axis of the film. As embodiments of the present invention function independently of the anisotropy of the film, they may be fabricated from a film without anisotropy (i.e., an isotropic thin-film) prepared by spinning the deposition apparatus at a rate of about 400 revolutions per minute in the presence of a constant magnetic field during deposition of the thin-film upon the substrate.

What is claimed as new and desired to be secured by a Letters Patent of the United States is:

1. In a logic system, a serially accessible crosstie memory element, comprising:

a ferromagnetic oblong layer having, denticulated margins parallel to and symmetric about the oblong centerline of the layer; and, electrical means external to, electrically insulated from, and running along the centerline of said ferromagnetic layer for creating a field pattern on said ferromagnetic layer;

whereby along said centerline a domain wall may be positioned, and along said domain wall crossties may be nucleated at and Bloch lines may be nucleated between, opposite narrow cross-sections of said margins, and Bloch lines may be propelled.

2. In a logic system as set forth in claim 1 wherein the memory element comprises said oblongly ferromagnetic layer terminating with at least one aculeate extremity.

3. In a logic system as set forth in claim 2 wherein said aculeate extremity is bisected by said centerline.

4. In a logic system as set forth in claim 1 wherein the memory element comprises said ferromagnetic layer terminating with at least one homecercal extremity.

5. In a logic system as set forth in claim 4 wherein said homocercal extremity is bisected by said centerline.

6. In a logic system, a crosstie memory element, comprising an oblongly ferromagnetic layer, longitudinally bounded by a pair of mirror image denticulated margins parallel to and symmetric about the centerline of the layer, each margin formed by an equal plurality of opposite, equally spaced abutting denticles, each denticle having a major edge intersecting a minor edge wherein for each denticle the projected length of its major edge upon the centerline exceeds the projected length of its minor edge upon the same centerline.

7. A logic system as set forth in claim 6 wherein said memory element comprises an oblongly serriform ferromagnetic layer having at least one acutely aculeate extremity formed by one or more edges on either side of said centerline such that on both sides of said centerline the length of the projection upon said centerline of those edges having a slope with the same sign with respect to said centerline as the sign of the slopes of said major edges on the same side of said centerline exceeds the length of the projection upon said centerline of all other edges forming the aculeate extremity on the same side of said centerline.

8. A logic system as set forth in claim 6 wherein said memory comprises an oblongly serriform ferromagnetic layer having at least one homocercal extremity formed by one or more edges on either side of said centerline such that on both sides of said centerline the length of the projection upon said centerline of those edges having a slope with the same sign with respect to said centerline as the sign of the slopes of said major edges on the same side of said centerline exceeds the length of the projection upon said centerline of all other edges forming the aculeate extremity on the same side of said centerline.

9. In a logic system, a crosstie memory element, comprising:

an oblongly ferromagnetic layer longitudinally bounded by denticulated margins parallel to and symmetric about its centerline, each margin formed by an equal plurality of oppositely spaced and similarly oriented abutting denticles, each denticle having a first outside edge of length A intersecting a second outside edge of length B, the first edge potentially forming an angle $\theta$ with said centerline and the second edge potentially forming an angle $\phi$ with said centerline, wherein:

$$A\ SINE\ 2\theta > B\ SINE\ 2\ \phi;$$ and external and electrically insulated main conductor means for creating a field pattern on said ferromagnetic layer;

whereby along said centerline a domain wall may be positioned on which crossties may be nucleated at and Bloch lines may be nucleated between opposite narrow cross-sections of said margins, and Bloch lines may be propelled in response to the introduction of electrical currents of selected magnitude and direction into said main conductor.

10. In a logic system as set forth in claim 9, a memory element including auxiliary electrical means comprising for each said denticulated margins a crenelated auxiliary electrical conductor external to, partially overlying the surface of, and electrically insulated from said ferromagnetic layer whereby only alternate denticles are overlain in each margin with only one denticle of each pair of opposite denticles overlain by the auxiliary conductor.

11. A serially accessible memory element for the storage and propagation of crosstie-Bloch line pairs, comprising:

a ferromagnetic strip bordered along each of its oblong edges by a plurality of uniformily oriented denticles arranged in a spaced relation to those denticles bordering the opposite edge, each denticle described by a first chord of length A having a projecting end meeting one end of a second chord of length B and a recessed end potentially intersecting the centerline of the strip at an angle $\theta$, the unmet end of the second chord potentially intersecting the centerline of the strip at an angle $\phi$, wherein:

$$A\cdot SINE\ 2\theta > B\cdot SINE\ 2\ \phi.$$

12. The ferromagnetic strip set forth in claim 11 further comprising said plurality of denticles arranged in abutting jugate pairs.

13. The ferromagnetic strip set forth in claim 11 further comprising said plurality of denticles separated by a baselength C wherein:

$$C = A\cdot COSINE\ \theta + B\cdot COSINE\ \phi.$$

14. The ferromagnetic strip set forth in claim 11 further comprising said plurality of denticles arranged in jugate pairs separated by a baselength C wherein:

$$C = 2[A\cdot COSINE\ \theta + B\cdot COSINE\ \phi].$$

15. The ferromagnetic strip set forth in claim 13 further comprising said plurality of denticles arranged in jugate pairs.

16. The ferromagnetic strip set forth in claim 13 further comprising said plurality of denticles arranged along opposite of said edges in an alternate sequence.

17. The ferromagnetic strip set forth in claim 14 further comprised of said plurality of denticles arranged in jugate pairs.

18. The ferromagnetic strip set forth in claim 14 further comprised of said plurality of denticles arranged along opposite of said edges in an alternate sequence.

19. In a crosstie memory system of the type using an oblongly detate ferromagnetic layer with oppositely directed induced magnetic domains separated by a domain wall running along its length, and with opposite denticles defining individual memory cells, the layer overlain with and electrically insulated from a single electrical conductor for applying magnetic field patterns along the length of the layer, the process of propagating along the domain wall binary information represented by the presence of crosstie-Bloch line pairs, comprising the steps of:

applying via said single conductor a magnetic propagation pulse in a negative direction perpendicular to the centerline of said layer whereby for each existing crosstie-Bloch line pair the Bloch line is propelled into the next memory cell;

applying via said single conductor a magnetic annihilation pulse having a magnitude sufficient to propel each last nucleated Bloch line to the position occupied by the nearest previously existing crosstie but of magnitude insufficient to propel any pre-existing Bloch line to the position occupied by the last nucleated crosstie, in a positive direction perpendicular to the easy axes of said layer.

20. In a process of propagating binary information as set forth in claim 19, subsequent to applying said propagation pulse and prior to applying said annihilation pulse, the additional step comprised of applying via said single conductor a magnetic nucleation pulse having a duration less than and an amplitude greater than those of said propagation pulse in a positive direction perpendicular to the centerline of said layer whereby a crosstie-Bloch line pair is nucleated between each existing crosstie-Bloch line pair.

21. A serially accessible memory element for the storage and propagation of crosstie-Bloch line pairs, comprising:

a ferromagnetic strip bordered along each of its edges by a plurality of uniformily oriented denticles arranged in a spaced relation to those denticles bordering the opposite edge, each denticle described by a first chord of length A having a projecting end meeting one end of a second chord of length B and a recessed end potentially intersecting a third chord at the centerline of the strip with an angle $\theta$, the unmet end of the second chord potentially intersecting the third chord at the centerline of the strip with an angle $\phi$, wherein:

$$A \cdot \text{SINE } 2\theta > B \cdot \text{SINE } 2\phi.$$

22. The memory element set forth in claim 21 further comprised of the centerline being straight.

23. The memory element set forth in claim 21 further comprised of the third chord being parallel to the centerline.

24. The memory element set forth in claim 21 further comprised of the centerline being circular.

25. The memory element set forth in claim 21 further comprised of the centerline being coiled.

26. The memory element set forth in claim 21 further comprised of the centerline being serpentine.

27. A serially accessible memory element, comprising:

a thin-film ferromagnetic layer of uniform thickness having opposed, symmetrically disposed serriform margins;

each margin formed by a plurality of denticles;

each denticle having a major edge intersecting a minor edge wherein for each denticle the projected length of its major edge upon an imaginary centerline disposed between the opposed margins exceeds the projected length of its minor edge upon the same centerline.

28. The memory element set forth in claim 27, further comprising the margins being symmetric about a centerline.

29. The memory element set forth in claim 28, further comprising the layer having an easy axis parallel to the centerline.

30. The memory element set forth in claim 28, further comprising the layer having a hard axis parallel to the centerline.

31. The memory element set forth in claim 28 further comprising the layer having the centerline parallel to an axis intermediate to an easy axis and a hard axis.

32. The memory element set forth in claim 27 further comprised of the layer being magnetically isotropic.

33. The memory element set forth in claim 27 further comprised of the layer being magnetically anisotropic.

34. The memory element set forth in claim 27 further comprising the margins being eccentrically symmetric about a centerline.

35. The memory element set forth in claim 34 wherein the centerline is straight.

36. The memory element set forth in claim 34 wherein the centerline is circular.

37. The memory element set forth in claim 34 wherein the centerline is coiled.

38. The memory element set forth in claim 34 wherein the centerline is serpentine.

39. A serially accessible memory comprising:

a ferromagnetic layer of uniform thickness less than one thousand angstrom units and having a pair of opposed, unidirectionally oriented, serriform margins;

each margin formed by a plurality of denticles;

each denticle having a major edge intersecting a minor edge wherein for each denticle the projected length of its major edge upon an imaginary centerline disposed between the opposed margins exceeds the projected length of its minor edge upon the same centerline.

40. The memory set forth in claim 39, further comprised of the layer being magnetically isotropic.

41. The memory set forth in claim 39, further comprised of the layer being magnetically anisotropic.

42. The memory set forth in claim 39, further comprised of a pair of opposed margins having a symmetry about a centerline.

43. The memory set forth in claim 42, further comprised of the symmetry being eccentric.

44. The memory set forth in claim 42, further comprised of the symmetry being regular.

45. A serially accessible memory element for storage and propagation of binary information, comprising:

an oblongly ferromagnetic layer of uniform thickness having denticulation on opposed margins formed by a plurality of asymmetric denticles unidirectionally oriented along the direction of propagation;

each denticle having a major edge intersecting a minor edge wherein for each denticle the projected length of its major edge upon an imaginary centerline disposed between the opposed margins exceeds the projected length of its minor edge upon the same centerline.

46. The memory element set forth in claim 45 further comprised of the layer being magnetically isotropic.

47. The memory element set forth in claim 45 further comprised of the layer being magnetically anisotropic.

48. The memory element set forth in claim 45 further comprised of the denticulation of opposed margins being symmetric.

49. The memory element set forth in claim 48 further comprised of the denticles in each margin abutting.

50. The memory element set forth in 49 claim further comprised of the denticles in each margin spaced apart.

51. The memory element set forth in claim 48 further comprised of the denticulation of opposed margins being eccentrically symmetric.

52. The memory element set forth in claim 51 further comprised of the denticles in each margin abutting.

53. The memory element set forth in claim 51 further comprised of the denticles in each margin spaced apart.

54. A serially accessible binary memory, comprising:
- a ferromagnetic strip of uniform thickness having unidirectionally oriented denticulation along a pair of opposed margins;
- the denticulation formed by a plurality of denticles;
- each denticle having a major edge intersecting a minor edge wherein for each denticle the projected length of its major edge upon an imaginary centerline disposed between the opposed margins exceeds the projected length of its minor edge upon the same centerline.

55. A serially accessible crosstie memory element, comprising:
- a magnetically isotropic thin-film ferromagnetic strip of uniform thickness with opposed unidirectionally oriented serriform margins, capable of sustaining a domain wall along its length for the storage and propagation of crosstie—Bloch line pairs;
- each margin formed by a plurality of denticles;
- each denticle having a major edge intersecting a minor edge wherein for each denticle the projected length of its major edge upon an imaginary centerline disposed between the opposed margins exceeds the projected length of its minor edge upon the same centerline.

56. The crosstie memory element set forth in claim 55, further comprising the strip being straight.

57. The crosstie memory element set forth in claim 55, further comprising the strip having at least one curve.

58. The crosstie memory element set forth in claim 55, further comprising the strip being circular.

59. The crosstie memory element set forth in claim 57, further comprising the strip being coiled.

60. The crosstie memory element set forth in claim 57, further comprising the strip being serpentine.

61. A crosstie memory element, comprising:
- a magnetically isotropic, ferromagnetic strip of uniform thickness defining a serially accessible datatrack along its length for the storage and propagation of crosstie-Bloch line pairs including opposing margins each formed of a plurality of denticles, each denticle having a major edge intersecting a minor edge wherein for each denticle the projected length of its major edge upon an imaginary centerline disposed between the opposed margins exceeds the projected length of its minor edge upon the same centerline.

62. The crosstie memory element set forth in claim 61, further comprising the strip being straight.

63. The crosstie memory element set forth in claim 61, further comprising the strip having at least one curve.

64. The crosstie memory element set forth in claim 63, further comprising the strip being circular.

65. The crosstie memory element set forth in claim 63, further comprising the strip being coiled.

66. The crosstie memory element set forth in claim 63, further comprising the strip being serpentine.

67. A crosstie memory element, comprising:
- a ferromagnetic layer of uniform thickness not greater than one thousand angstrom units, having opposed, unidirectionally oriented, serriform margins defining a serially accessible data-track along its length for the storage and propagation of crosstie-Bloch line pairs;
- each margin formed by a plurality of denticles;
- each denticle having a major edge intersecting a minor edge wherein for each denticle the projected length of its major edge upon an imaginary centerline disposed between the opposed margins exceeds the projected length of its minor edge upon the same centerline.

68. The crosstie memory element set forth in claim 67, further comprising the layer having at least one curve.

69. The crosstie memory element set forth in claim 68, further comprising the layer being coiled.

70. The crosstie memory element set forth in claim 68, further comprising the layer being serpentine.

71. The crosstie memory element set forth in claim 68, further comprising the layer being circular.

72. The crosstie memory element set forth in claim 67, further comprising the layer being magnetically isotropic.

73. The crosstie memory element set forth in claim 67, further comprising the layer having regular, symmetrically disposed serriform edges.

74. The crosstie memory element set forth in claim 67, further comprising the layer having unidirectionally oriented serriform edges.

75. The memory set forth in claims 27, 39, 45 or 54 further comprising the ferromagnetic layer supporting the propagation of Bloch line—crosstie pairs between the opposed margins.

76. The memory set forth in claims 27, 39, 45 or 54 further comprising the ferromagnetic layer being a unitary component.

77. The memory set forth in claims 27, 39, 45, 54, 55, or 67, comprising each denticle having a first outside edge of length A intersecting a second outside edge of length B, the first edge potentially forming an angle $\theta$ with an imaginary centerline disposed between the opposed margins, and the second edge potentially forming an angle $\phi$ with said centerline, wherein:

$$A \text{ SINE } 2\theta > B \text{ SINE } 2\theta.$$

* * * * *